(12) United States Patent
Young et al.

(10) Patent No.: US 8,293,053 B2
(45) Date of Patent: Oct. 23, 2012

(54) FABRICATION METHODS FOR MICROFLUIDIC PUMP AND VALVE STRUCTURES

(75) Inventors: Lincoln C. Young, Ithaca, NY (US); Peng Zhou, Newton, PA (US)

(73) Assignee: Rheonix, Inc., Ithaca, NY (US)

( * ) Notice: Subject to any disclaimer, the term of this patent is extended or adjusted under 35 U.S.C. 154(b) by 875 days.

(21) Appl. No.: 12/248,521

(22) Filed: Oct. 9, 2008

(65) Prior Publication Data

US 2009/0056861 A1    Mar. 5, 2009

Related U.S. Application Data

(60) Division of application No. 11/242,694, filed on Oct. 3, 2005, now Pat. No. 7,832,429, which is a continuation-in-part of application No. 10/964,216, filed on Oct. 13, 2004, now Pat. No. 7,608,160.

(51) Int. Cl.
    *B29C 65/54* (2006.01)
(52) U.S. Cl. ............ 156/160; 156/285; 156/292
(58) Field of Classification Search .......... None
    See application file for complete search history.

(56) References Cited

U.S. PATENT DOCUMENTS

| | | | | |
|---|---|---|---|---|
| 3,935,358 A | * | 1/1976 | Wyeth et al. | 428/166 |
| 4,867,829 A | * | 9/1989 | Moriya et al. | 156/251 |
| 5,731,212 A | | 3/1998 | Gavin et al. | |
| 6,619,311 B2 | * | 9/2003 | O'Connor et al. | 137/109 |
| 2002/0166585 A1 | | 11/2002 | O'Connor et al. | |
| 2003/0145942 A1 | * | 8/2003 | Andrews et al. | 156/285 |

FOREIGN PATENT DOCUMENTS

| DE | 19947495 A1 | 5/2001 |
|---|---|---|
| WO | 2005114169 A | 12/2005 |

OTHER PUBLICATIONS

Skowronski, Maik; Patent Cooperation Treaty PCT International Search Report; Jun. 20, 2007; European Patent Office.
Skowronski, Maik; Patent Cooperation Treaty PCT Written Opinion of the International Searching Authority; Jun. 20, 2007; European Patent Office.

* cited by examiner

*Primary Examiner* — John L. Goff
*Assistant Examiner* — Barbara J. Musser
(74) *Attorney, Agent, or Firm* — William Greener; Bond, Schoeneck & King, PLLC

(57) ABSTRACT

Plastic microfluidic structures having a substantially rigid diaphragm that actuates between a relaxed state wherein the diaphragm sits against the surface of a substrate and an actuated state wherein the diaphragm is moved away from the substrate. As will be seen from the following description, the microfluidic structures formed with this diaphragm provide easy to manufacture and robust systems, as well readily made components such as valves and pumps.

10 Claims, 23 Drawing Sheets

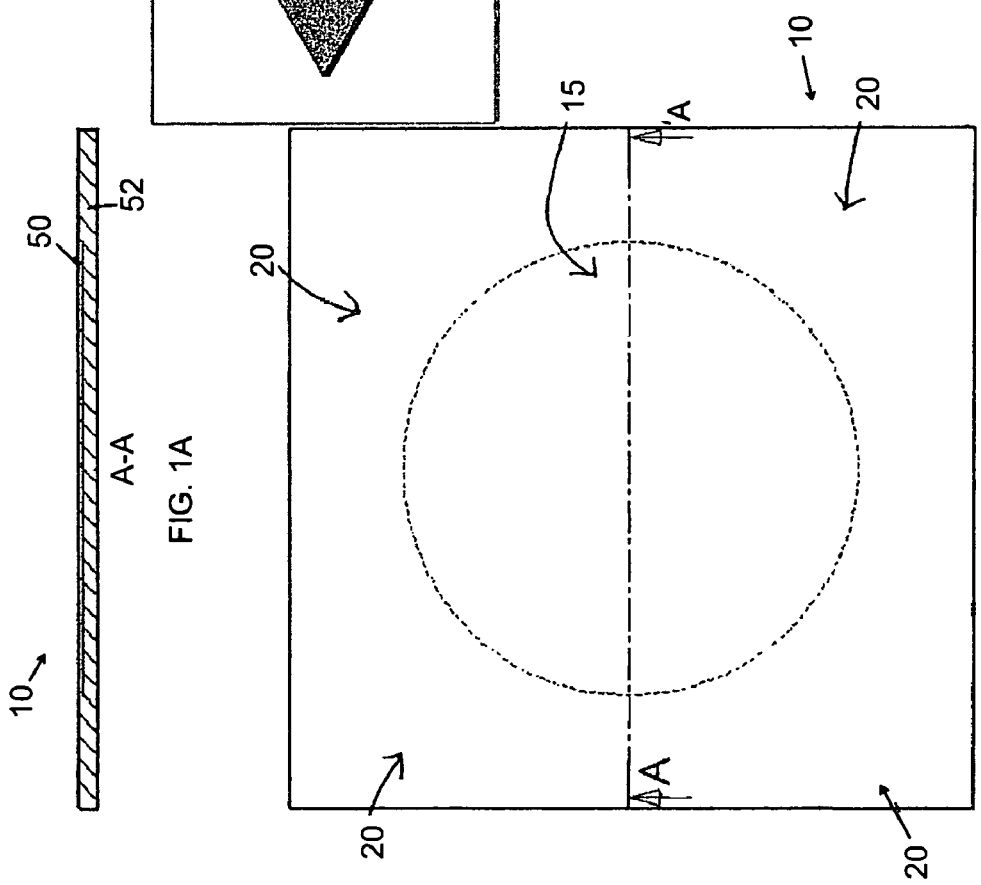

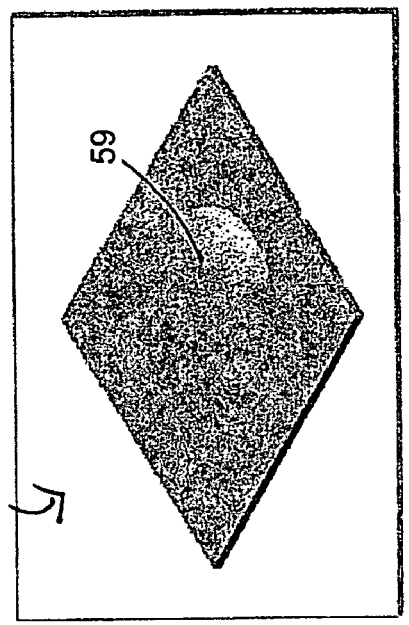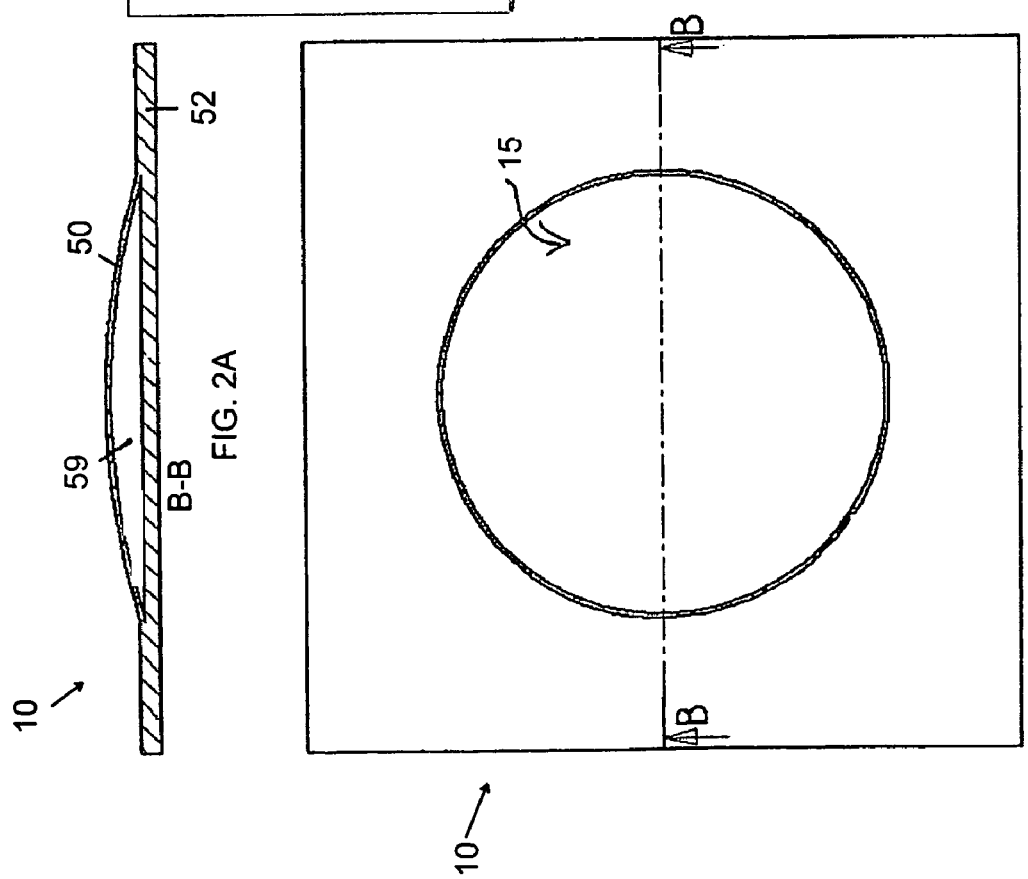

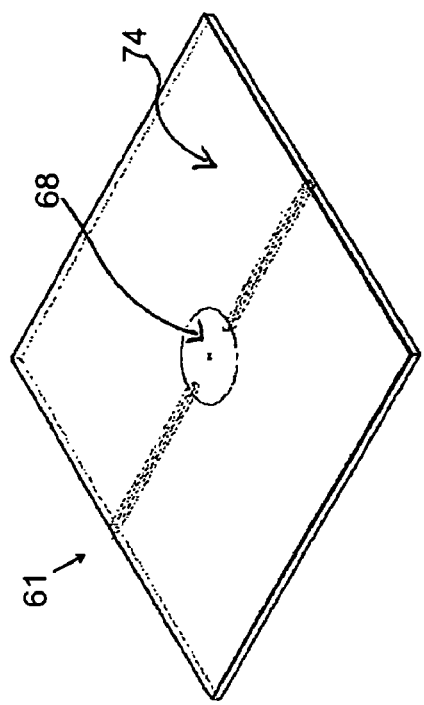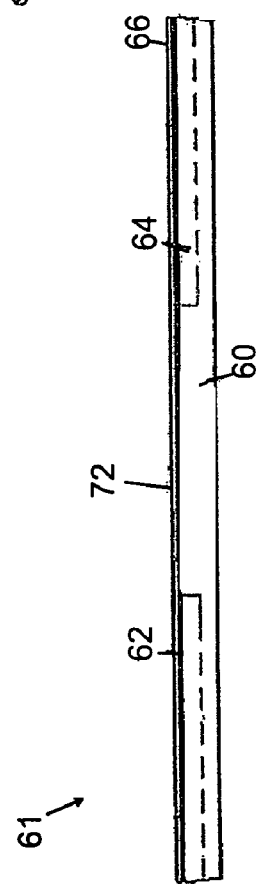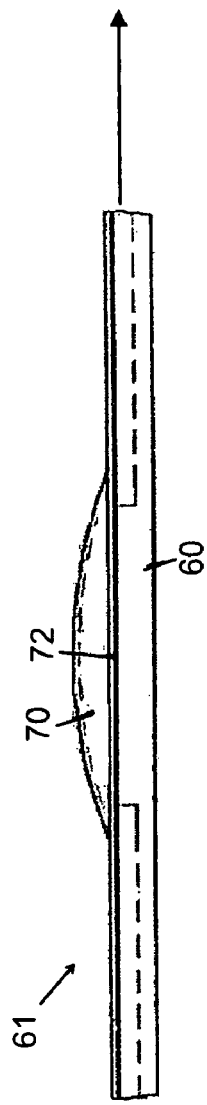

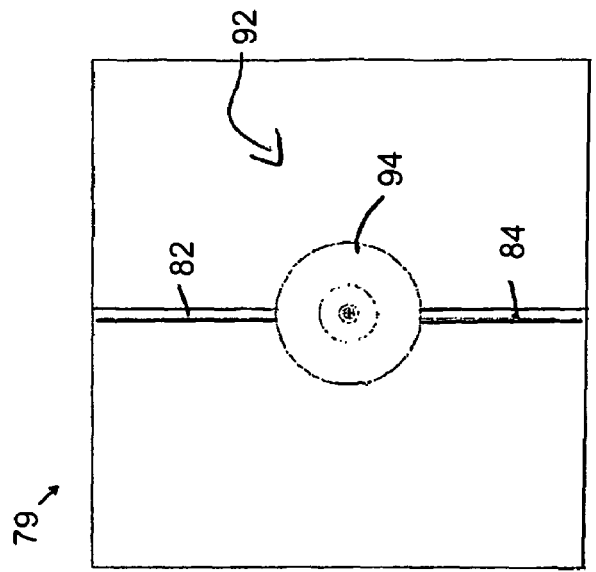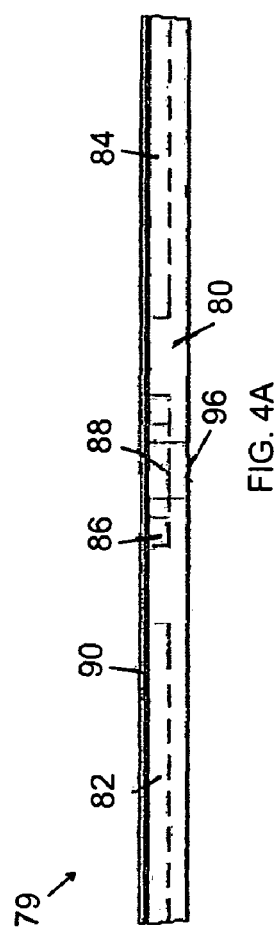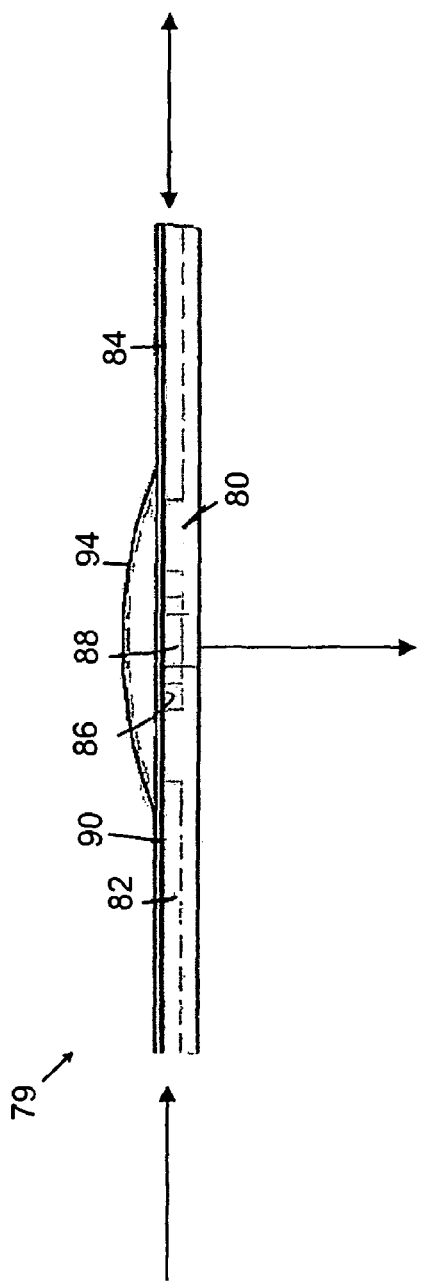

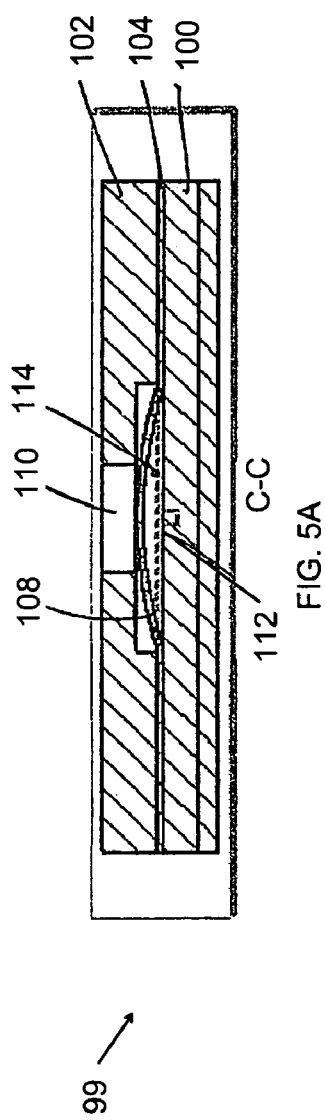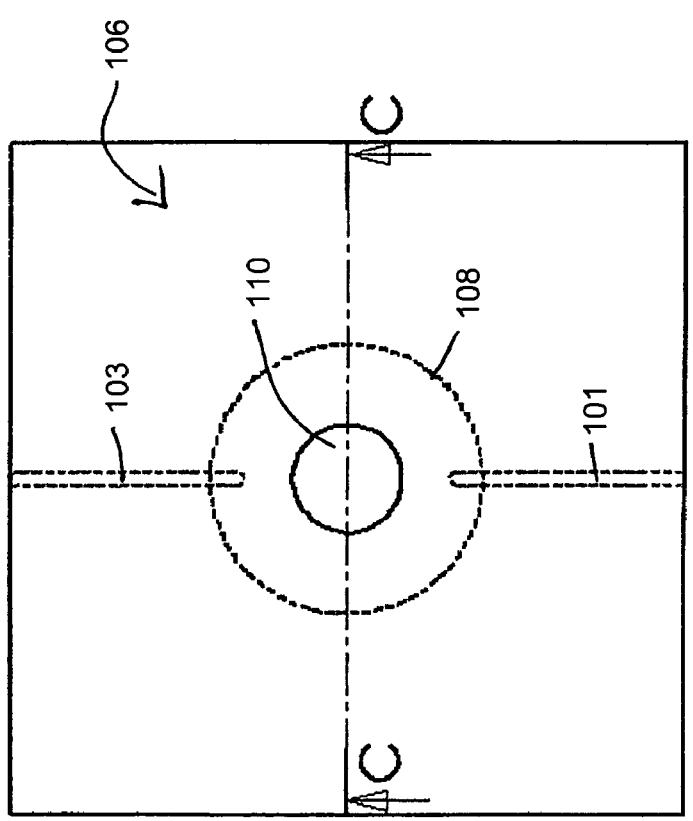
FIG. 5A
FIG. 5B

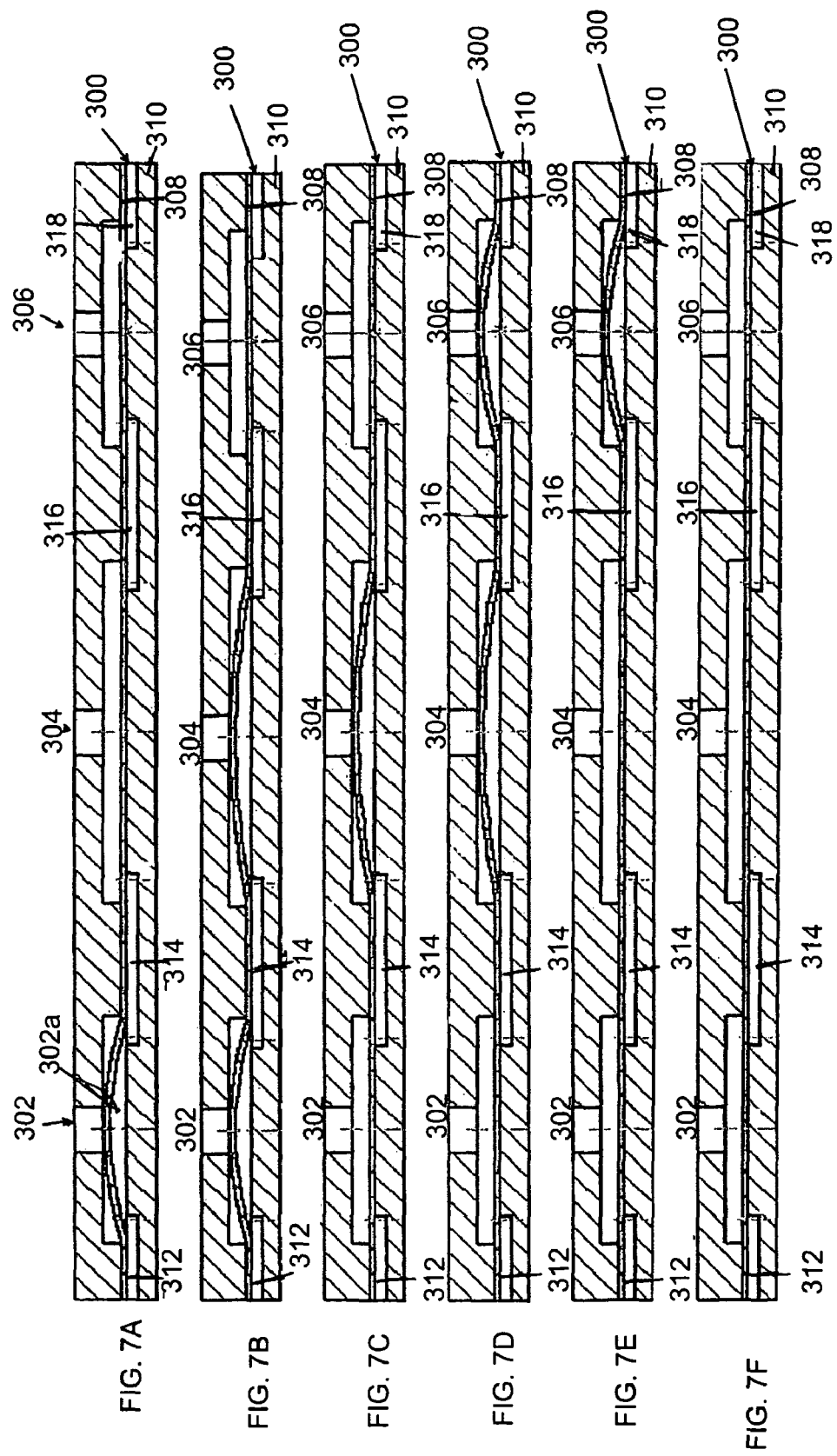

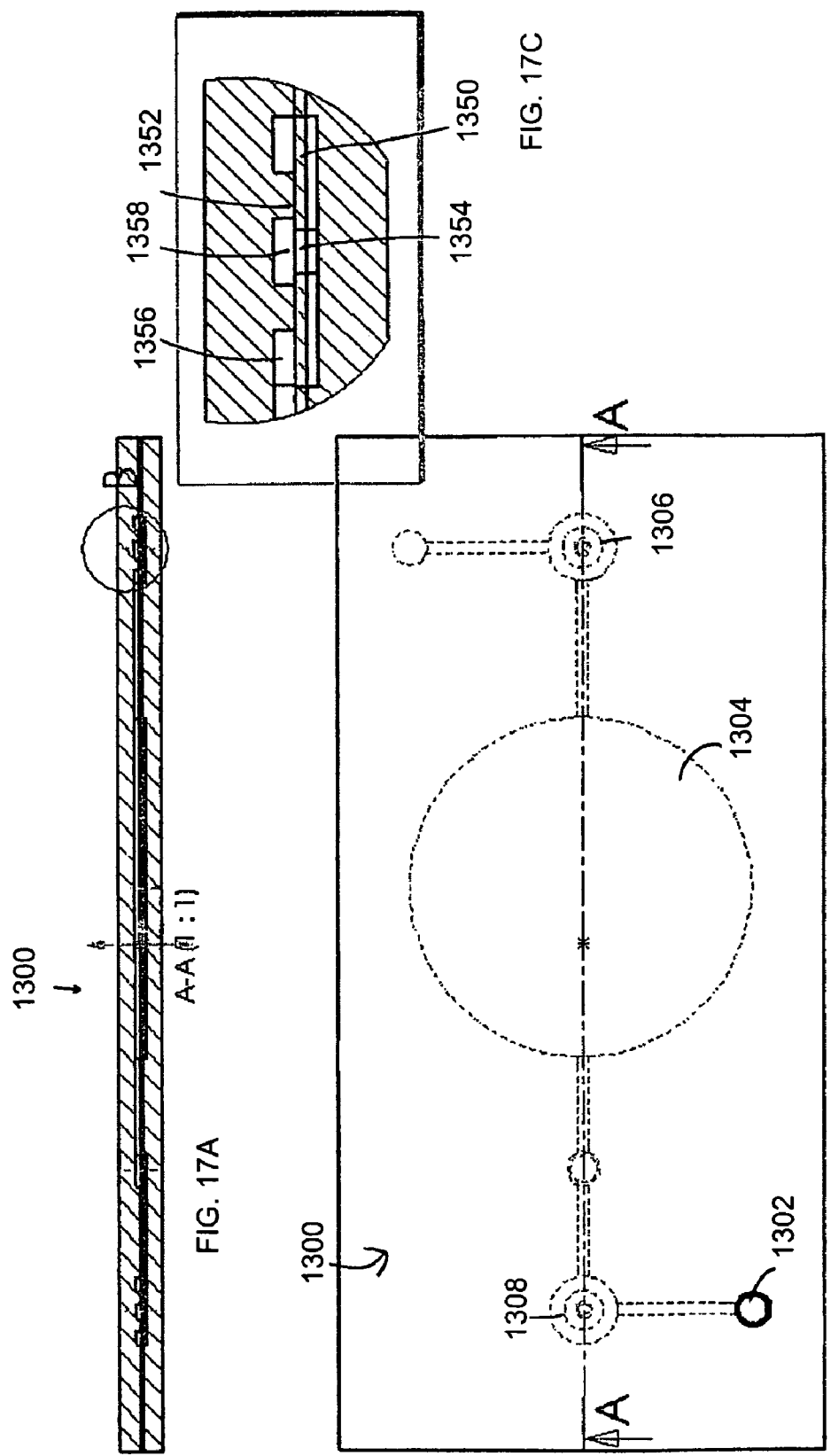

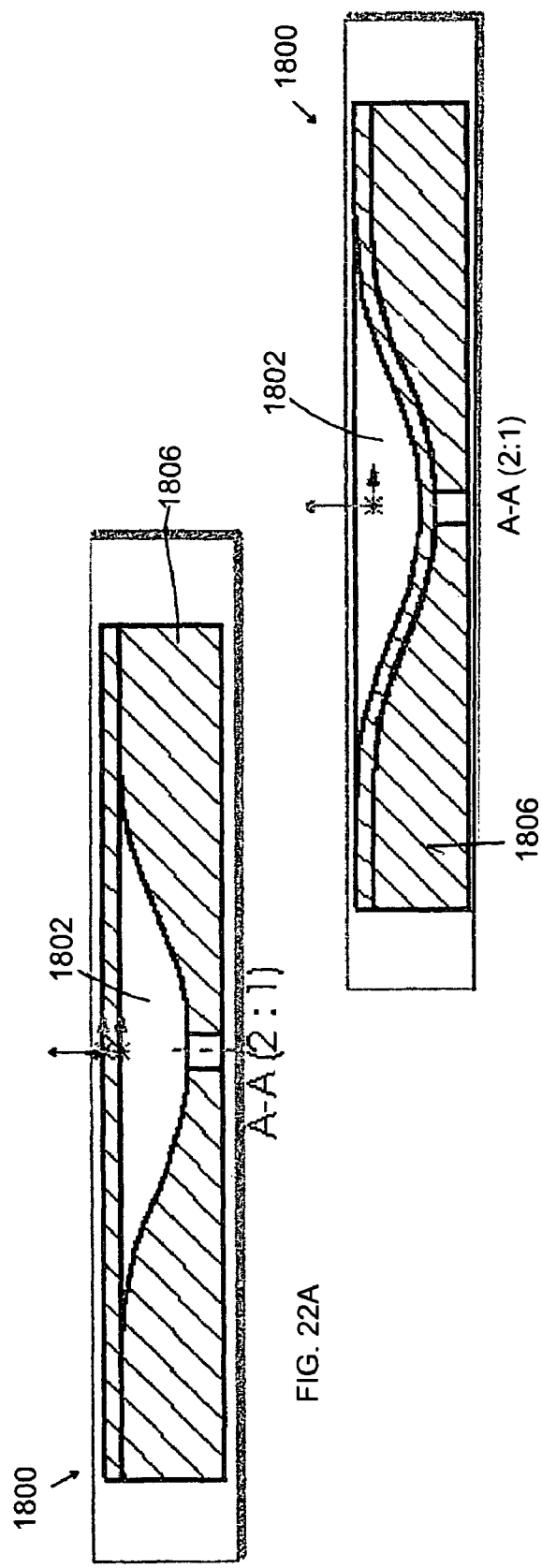

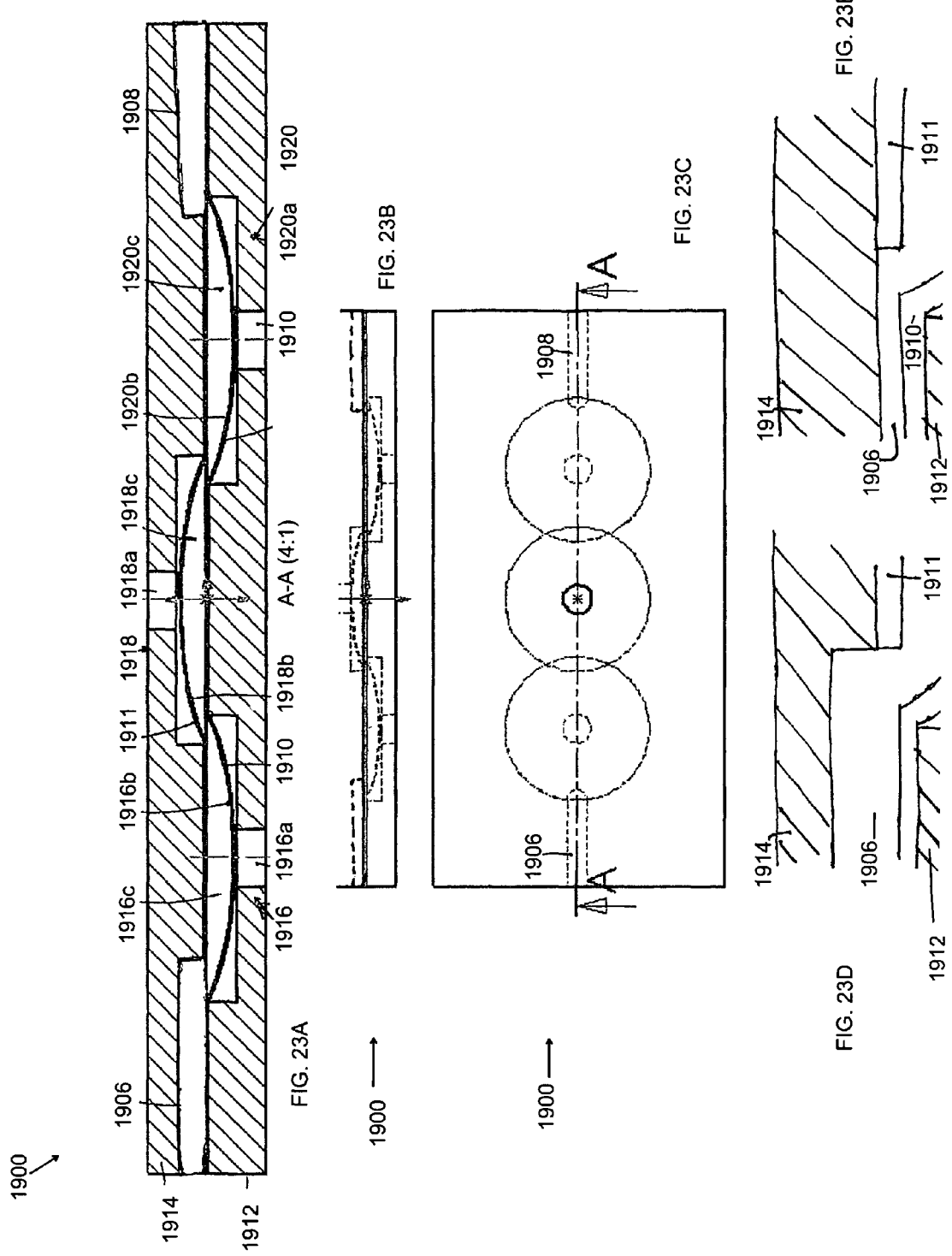

U.S. 8,293,053 B2

FABRICATION METHODS FOR MICROFLUIDIC PUMP AND VALVE STRUCTURES

RELATED APPLICATION DATA

This application is a divisional of U.S. application Ser. No. 11/242,694 filed on Oct. 3, 2005 now U.S. Pat. No. 7,832,429, which is a continuation-in-part of U.S. application Ser. No. 10/964,216 filed on Oct. 13, 2004 now U.S. Pat. No. 7,608,160, and claims the benefit of priority of the aforementioned applications.

FIELD OF THE INVENTION

Embodiments of the invention generally pertain to the field of microfluidics. In particular, embodiments of the invention pertain to microfluidic diaphragm structures, microfluidic chips, automated microfluidic reagent processing systems, and methods thereof.

BACKGROUND OF THE INVENTION

Technologies relating to systems and methods for manipulating minute volumes of fluids, such as biological and chemical fluids, are widely referred to as microfluidics. The realized and potential applications of microfluidics include disease diagnosis, life science research, and biological and/or chemical sensor development.

A microfluidic structure including a substrate having one or more microfluidic channels or pathways and a cover plate or a second or more substrates with fluid pathways that may or may not be interconnected, may commonly be referred to as a microfluidic chip. A highly integrated microfluidic chip is sometimes called a 'Lab-on-a-chip'. Inorganic microfluidic chips having substrates made of glass, quartz or silicon have advantageous organic solvent compatibilities, high thermal and dimensional stability and excellent feature accuracy. These chips are typically fabricated using well-established microfabrication technologies developed for the semiconductor industry. However, the material and production costs of the inorganic chips may become prohibitively high especially when the fluidic pathway(s) requires significant area or the chip has to be disposable. In addition, many established biological assays were developed utilizing the surface properties of polymeric substrates. The research effort required to redevelop these assays on inorganic surfaces would require significant time and resource investments.

As an alternative to inorganic microfluidic structures such as those referred to immediately above, microfluidic structures or devices can also be made from polymeric materials. Polymeric microfluidic structures have advantageously low material costs and the potential for mass production.

As such, scientists and engineers are growing ever closer to delivering on the promise of inexpensive and fully integrated microfluidic systems. However, there are remaining obstacles. For these systems to be useful and helpful, they must provide the components and structures that are necessary to carry out assays and other operations of interest. These components include pumps, valves, and channels, as well as more complex structures, such as mixing devices and sensors. Although, the materials employed to manufacture microfluidic devices are becoming less expensive, the actual costs of these devices will not become sufficiently low for mass use until the costs of manufacturing these components also decreases.

However, the fabrication of polymeric microfluidic chips presents a variety of challenges and with these challenges come low yields and higher costs. For example, microfluidic chips may contain sealed microstructures. They can be formed by enclosing a substrate having a pre-fabricated fluid pathway, or other microfeatures, with a thin cover plate, or with one or more additional substrates to form a three-dimensional fluid network. The pathways or other microstructures have typical dimensions in the range of micrometers to millimeters. This multilayer microfluidic structure is integrated, or joined together, by various conventional techniques. These techniques include thermal, ultrasonic, and solvent bonding. Unfortunately, these techniques often significantly alter the mated surfaces and yield distorted or completely blocked microfluidic pathways due, for example, to the low dimensional rigidity of polymeric materials under the aforementioned bonding conditions. Once the device is assembled, any blockage or obstruction in a channel is difficult or impossible to reverse. The result is that the device is lost and the manufacturing yield is lowered.

Even if the loss were acceptable, the manufacturing process is often costly because each device must be independently designed for each application. Further, each component, whether a valve, pump, or mixer, is typically specially designed for each application. To avoid designing these active features, many microfluidic systems use exterior syringe, diaphragm, or peristaltic pumps to induce fluid flow through in the microfluidic network. These systems tend to be much larger in volume than the microfluidic systems they connect to, causing problems with flow control resolution and accuracy. In the case of valves, they often have very large (on the order of 10× or more) the swept volume of the systems they are controlling. This causes great difficulty with separations, mixing, and other microfluidic functions. Companies like Upchurch Scientific (Oak Harbor, Wash.) have dedicated significant resources to the development of components that will ease the effects of these volumetric inconsistencies. However, micro pumps and valves, active components sharing the size scale and seamlessly integrated with the rest of the microfluidic system, are required.

Many of these active microfluidic components have been developed. However, very few possess the criteria necessary for integration into a complex microfluidic system. Most require very complex fabrication sequences; producing the active component is such a sensitive and intricate process that very little window is left to integrate the rest of the microfluidic system. One is left with an exquisite pump or valve with no effective way to connect or incorporate it into the microfluidic system. Often the substrates and processes are prohibitively expensive for a disposable device. Finally, the materials required to build the pump can interfere, or be incompatible with, the process the microfluidic system was intended to perform. This builds substantial non-refundable engineering costs into product development and increases the cost of the product.

In view of the foregoing, the inventors have recognized that a simple, reproducible, and high yield method for enclosing polymeric microstructures, and for forming components of these structures, particularly valve and pump systems, with easy fabrication integration is needed. Accordingly, there is a need in the art for microfluidic structures and fabrication methods that address the recognized shortcomings of the current state of technology, and which provide further benefits and advantages as those persons skilled in the art will appreciate.

SUMMARY OF THE INVENTION

The systems and methods described herein include microfluidic structures having a substantially rigid diaphragm that is actuatable between a relaxed state wherein the diaphragm sits against the surface of a substrate and an actuated state wherein the diaphragm is moved away from the substrate. As will be seen from the following description, the microfluidic structures formed with this diaphragm provide easy to manufacture and robust systems, as well as readily made components such as valves and pumps.

In one particular embodiment a polymeric microfluidic structure in which a substantially rigid plastic membrane is fixedly bonded or laminated to an essentially planar rigid plastic substrate with a weak organic solvent acting as a bonding agent. In a specific aspect, the substrate includes microfeatures, and the device includes a bond-free segment surrounded and defined by a bonded area between the deformable membrane and the essentially planar substrate surface, resulting in a valve structure. In some embodiments, a second substrate is bonded to the upper surface of the membrane and includes a chamber than may be used to apply pneumatic pressure to the membrane. According to methods consistent with the use of the invention, pneumatic pressure or force is applied through the chamber to deform the membrane, thus actuating the valve. In some embodiments, a pump comprises a plurality of valve structures interconnected by microchannels. Valves, pumps, and microfluidic reservoirs can be interconnected with microchannels to form circulators, mixers, or other structures with functionality relevant to microfluidic processing and analysis.

In particular, the systems and methods described herein include a microfluidic device, having a first rigid plastic substrate having upper and lower surfaces, and a substantially rigid plastic membrane, contacting and joined with the upper surface of the first substrate, and having a relaxed state wherein the plastic membrane lies substantially against the upper surface of the first substrate and an actuated state wherein the membrane is moved away from the upper surface of the first substrate. The first rigid plastic substrate may have microfeatures formed in the substrate and the substantially rigid plastic membrane is often disposed over at least one of the microfeatures. The substantially rigid plastic membrane may have a Young's modulus of between about 2 Gpa and about 4 Gpa and have a thickness, or width, selected for allowing deformation upon application of appropriate mechanical force. The membrane may have a thickness of between about 10 µm and about 150 µm, and more specifically between about 15 µm and about 75 µm.

The mechanical pressure to which the membrane will respond may be a positive pressure applied to deform the membrane towards the substrate and may be less than about 50 psi, and may be between 3 psi and about 25 psi. Alternatively, and optionally additionally, the mechanical pressure may be a negative pressure applied to deform the membrane away from the substrate and has a magnitude less than about 14 psi and may have a magnitude of between about 3 psi and about 14 psi.

Typically, the membrane and the first substrate are made from substantially a same material, and typically at least one of the membrane and the first substrate is a thermoplastic material, or a linear polymeric material and may be made from one of polymethyl methacrylate, polystyrene, polycarbonate, and acrylic.

The substantially rigid plastic membrane typically has an unbonded region being unattached from the first substrate. Often, the unbonded region of the membrane at least partially overlies a first channel and a second channel disjoint from the first channel, with both channels being disposed in the first substrate. In the relaxed state the membrane forms a seal between the first and second channels. Optionally, the unbonded region of the membrane at least partially overlies a valve-seat formed in the first substrate, disconnected from and substantially between the first and second channels. The valve seat may include a ridge substantially perpendicular to a longitudinal axis of the first and second channels. Further, the unbonded region of the membrane may at least partially overlie a first channel and a second channel disjoint from the first channel. Both of these channels can be disposed in the first substrate, and in the actuated state the membrane separates from the upper surface of the first substrate to provide a cavity suitable for fluid flow between the first and second channels. Optionally, there may also be a through-hole extending from the upper surface of the first substrate to the lower surface of the first substrate. The unbonded region may have any suitable geometry and the geometry selected will of course depend upon the application at hand. In certain embodiments, the unbonded region may be circular, substantially elliptical, substantially rectangular, with rounded corners, or any geometry appropriate for the application.

In certain embodiments, the device includes a second rigid plastic substrate contacting and joined with an upper surface of the membrane, and optionally the first substrate, the second substrate, and the membrane are made of substantially a same material, such as polystyrene. The second substrate may include a chamber lying substantially above the unbonded region of the membrane and sized such that the unbonded region of the membrane can be moved away from the upper surface of the first substrate and remain substantially enclosed by the chamber.

The device may have a pump that includes a pair or group of disconnected unbonded regions, each forming an independently actuatable valve structure that are connected typically in series by microchannels, or some type of fluid passage. The microchannels may have varying resistances to fluid flow, and to that end may have different sizes, geometries and restrictions. Further optionally, the device can include features, such as channels that have a geometry that favors fluid flow in one particular direction of flow.

In one embodiment, a plurality of pumps may have a shared valve structure, and in particular, the pumps may have a shared valve structure that includes a membrane disposed above three or more microchannels to provide a plurality of fluid ports coupled with the shared valve. A reservoir can be provided that is capable of storing a fluid material, which may be a liquid, a gas, a solid that is substantially dissolved in a fluid material, a slurry material, an emulsion material, or a fluid material with particles suspended therein. The reservoir may be substantially vertical and can couple with a liquid extraction device for extracting liquid from within the reservoir at or near defined vertical levels. The reservoir may also be arranged to be substantially vertical and contains a fluid and particles. The pump can couple to the reservoir so as to circulate fluid through the device in a manner that prevents the particles from settling at a top or a bottom of the reservoir. The reservoir can couple between a first and a second one of the independently actuatable valve structures and a plurality of reservoirs may be interconnected through the pump. The pump can include or connect to a shared valve structure to allow the pump to pass fluid from the plurality of reservoirs.

In a further embodiment, the device may have a pump having one unbonded region forming an exogenously actuatable diaphragm structure, interconnected by microchannels to two unbonded regions to form passive valve structures that are actuatable by fluid flowing through the pump. In yet another embodiment, the pump may have a plurality of disconnected unbonded regions, each forming an independently actuatable diaphragm structure, with each diaphragm structure partially overlapping at least one other diaphragm structure.

Optionally, the device may include a stopping mechanism, such as a mechanical stop, disposed above the membrane sized, and shaped and positioned to prevent the membrane from moving beyond a distance from the first substrate.

In another aspect, the systems and methods described herein may be understood as a microfluidic device that has a first polystyrene substrate having upper and lower surfaces and microfeatures formed therein, and a polystyrene membrane solvent bonded to the upper surface of the first substrate, and having a relaxed state wherein the polystyrene membrane lies substantially against the upper surface of the first substrate and an actuated state wherein the polystyrene membrane is moved away from the upper surface of the first substrate.

The device may couple to a controller capable of sequentially activating the valves to operate the pumps formed on the substrate. This can allow for mixing materials within the device. For example, the controller can operate a reservoir pump chamber and the two other pump chambers, whereby a material may be drawn into the reservoir pump chamber and then partially drawn into respective ones of the two pump chambers and the partially drawn material in one of the two pump chambers may be subsequently returned to the reservoir pump chamber. The material may comprise any suitable material, and in some practices and applications, it includes biological materials, such as an aqueous solution of enzymes, proteins, probes, RNA, DNA, or other biological materials.

The foregoing and other objects, features, and advantages of embodiments of the present invention will be apparent from the following detailed description of the preferred embodiments, which refer to the several figures.

BRIEF DESCRIPTION OF THE DRAWINGS

FIG. 1A illustrates a microfluidic structure comprising a substantially rigid membrane bonded to a rigid plastic substrate. The membrane is in a relaxed state.

FIGS. 1B-1C show alternate views of the device of FIG. 1A.

FIG. 2A illustrates a microfluidic structure comprising a substantially rigid plastic membrane bonded to a rigid plastic substrate. The membrane is in an actuated state.

FIGS. 2B-2C show alternate views of the device of FIG. 2A.

FIGS. 3A and 3C illustrate two views of a microfluidic valve, including a substantially rigid plastic membrane and a rigid plastic substrate with microfeatures.

FIG. 3B shows the device of FIG. 3A, with the membrane in an actuated state.

FIGS. 4A and 4C show a three dimensional valve, wherein the substrate includes a valve seat and a through-hole.

FIG. 4B shows the device of FIG. 4A, with the membrane in an actuated state.

FIGS. 5A and 5B show a microfluidic valve including a second substrate with an interdisposed chamber that can be used to apply pressure to the membrane in order to actuate the valve.

FIG. 7A-7F illustrates one manner in which the pump of FIG. 6 may operate in a peristaltic-like cycle.

FIGS. 17A-C show a pump structure including passive check valves.

FIGS. 22A and 22B show a drive chamber sized and shaped to support the membrane upon actuation.

FIGS. 23A-E show a pump with no microchannels.

DETAILED DESCRIPTION OF THE INVENTION

Figure 6A:
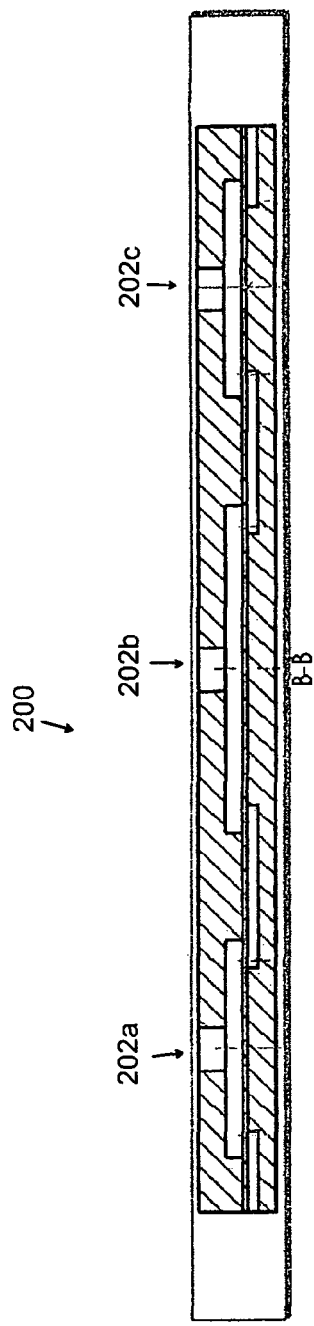
FIG. 6A-6B shows a microfluidic pump comprising three microfluidic valve structures.

As used herein, the word "microstructure" generally refers to structural features on a microfluidic substrate component with walls having at least one dimension in the range of about 0.1 micrometer to about 1000 micrometers. These features may be, but are not limited to, microchannels, microfluidic pathways, microreservoirs, microvalves or microfilters. The term "polymeric" refers generally to a macromolecular structure or material having a molecular weight that is substantially higher than the constituent monomers and, which may be, but does not have to be, produced by a polymerization reaction. All materials commonly and herein referred to as "plastic" materials include polymeric materials. The term "acrylic" refers to materials including Acrylite®, Plexiglas®, PMMA and other trade names of polymethylmethacrylate. "Linear polymeric materials" generally include polymeric materials in which molecules form long chains without branches or cross-linked structures. A "two-dimensional microfluidic network" refers to fluidic connectivity of at least two microfluidic pathways or channels that co-exist within the plane of the component. A "three-dimensional microfluidic network" refers to fluidic connectivity of at least three microfluidic pathways or channels arranged in such a way that at least one of the three channels is out of the plane of the component. The term of "weak solvent" as used herein refers to an organic solvent capable of forming a bonded interface between two mating surfaces under appropriate temperature (i.e. due to heat) and force (i.e., due to pressure, vacuum and/or mass) conditions but having little or substantially no bonding effect otherwise, such as in room temperature and ambient force conditions. The term "inert solvent" generally refers to a solvent that is miscible with the weak solvent but having no bonding capability alone. The term "solvent bonding" generally refers to a bonding process in which a solvent is used to physically bond two surfaces together. The term "weak solvent bonding" generally refers to a solvent bonding process in which a weak solvent is used.

Some embodiments of the invention are based on the surprising discovery by the inventors that when a weak solvent bonding agent is used as a lamination solvent to join non-elastomeric polymers such as polystyrene, polycarbonate, acrylic or other linear polymers under mild conditions, microstructures disposed on the substrate are not adversely affected. This discovery enables practical and economical fabrication of prototype as well as production fabrication of laminated, polymeric microfluidic structures. A further realization, is that certain plastic materials, such as but not limited to polystyrene, are reasonably rigid but under certain applications, provide a deformable diaphragm that may be employed in a fluidic component, such as a pump or valve.

According to an aspect, the weak solvent bonding agent may be chemically defined as:

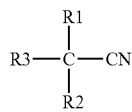

where, R1=H, OH or R, where R=alkyl, or is absent, R2=H, OH or R, where R=alkyl, or is absent, and R2=H, OH or R, where R=alkyl, or is absent.

Alternatively, the weak solvent may have a chemical formula of:

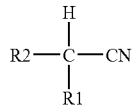

where R1=H, OH or R, where R=alkyl, or is absent, and R2=H, OH or R, where R=alkyl, or is absent.

Alternatively, the weak solvent may have a chemical formula of:

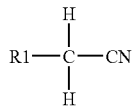

where R1=H, OH or R, where R=alkyl, or is absent.

In a particular aspect, the weak solvent bonding agent is acetonitrile. Acetonitrile is a versatile solvent that is widely used in analytical chemistry and other applications. It is 100% miscible with water and exhibits excellent optical properties. Acetonitrile has a favorable dielectric constant, solubility parameters and low hydrogen bonding ability, which make it a useful solvent for protein and DNA sequencing. Acetonitrile, however, is not typically a solvent of choice for organic synthesis due to its limited solubility to many organic molecules. Compared to many ketones, halogenated hydrocarbons, ether or aromatic molecules, acetonitrile is understood to have very limited ability to swell polymeric materials. As such, acetonitrile is referred to herein as a weak solvent. Since it is used as a bonding agent in the various embodiments of the invention described in detail below, it represents an exemplary weak solvent bonding agent for laminating polymeric microfluidic structures. Thus, the weak ability of acetonitrile to dissolve a plastic surface makes it highly suitable for laminating polymeric materials such as polystyrene, polycarbonate, acrylic and other linear polymers. For example, microstructures disposed on a polystyrene substrate that was treated with acetonitrile at room temperature for at least several minutes did not exhibit any noticeable feature damage. Acrylic and polycarbonate have been observed to be more susceptible than polystyrene to acetonitrile, but this increased susceptibility can be controlled by applying the acetonitrile at a lower temperature or, alternatively, by using a combination of acetonitrile and other inert solvents.

An apparently unique feature of acetonitrile lamination is that this weak solvent has remarkably different solubility strengths at different temperatures when used in relation to polymeric components of microfluidic structures according to embodiments of the invention. Although it is well known that the solubility of most inorganic or organic substances increases as the temperature of the applied solvent rises, utilizing this solubility variation at different temperature for controlled microfluidic structure solvent lamination requires a fine operating window. The substrate must be able to withstand solvent treatment at room temperature while increasing its solubility sufficiently at elevated temperature and pressure. Acetonitrile used as a laminated microfluidic structure bonding agent provides the required operating range in contrast to all currently known strong organic solvents that are generally used for solvent lamination.

A beneficial aspect of acetonitrile-bonded lamination is that the process according to an embodiment of the invention allows substrate alignment for structures containing multi-component layers or fluid networks constructed utilizing both a cover plate and a base plate. Unlike conventional strong solvent lamination, which tends to penetrate the polymeric substrate surface aggressively and create a tacky bonding surface within seconds of solvent application, acetonitrile at room temperature exhibits a very weak power to soften the substrate upon application. When the acetonitrile is present between the mated surfaces, at lower temperature prior to thermal activation, it functions similar to a lubricant and allows the adjacently contacted surfaces to slide freely against each other. Upon thermal activation of the acetonitrile and application of pressure, the mated surfaces form a substantially irreversible bond.

Formation of three-dimensional fluid networks is important for many microfluidic applications. Similar to the two-dimensional printed circuit board (PCB) case in which the "printed" wires cannot cross each other without electric connectivity, fluidic channels or pathways also cannot typically cross each other without fluidic connectivity. To build a simple crossover structure in a microfluidic chip, the fluid channels are typically located at different layers at the crossover section and joined by vertical fluid pathways to complete the fluid network. Solvent bonding provides a bond between the layers that does not impede fluid egress through the vertical connecting structures.

In the case where the microstructure(s) in a component is small, e.g., having a depth on the order of about 5 μm or less, and the planar width of the pattern is large, e.g., 1 mm or more, and in addition the enclosing component is a thin film having a thickness of about 200 μm or less, the lamination force applied to the component pair may cause the upper component to impinge upon and bond to the lower component causing blockage of the pathway. One way to prevent this problem is to control the presence of bonding agent in the microstructure(s). If the applied bonding agent is not present in the pathway during thermal activation, the upper component will not bond to the pathway of the lower component.

The upper component will lift back to its intended position when the assembly returns to room temperature.

There are a number of ways in which the acetonitrile bonding agent can be manipulated to allow lamination of two components without deforming the enclosed microstructure(s). When the base component containing the microstructure(s) is brought into contact with the cover component, the space between the two components may typically be on the order of about 50 to 100 nm, which is much less than the depth of the microstructures, i.e., about 1 μm or more. It is well known that the capillary force of a liquid is indirectly proportional to the width of the gap the liquid is filling. Thus there will be a higher capillary force in the area to be bonded than in the microstructure(s). This phenomenon can be exploited to contain the weak solvent only to the areas of the structure intended for bonding. As previously mentioned, the two substrates can be sprayed with solvent and then contacted. The solvent will generally completely fill the void between the substrates, including the microstructures. The solvent can subsequently be suctioned from the microstructures leaving the solvent to remain only in the areas between the substrates that are intended for bonding to occur. Alternatively, if the opposing surfaces of the substrates are contacted prior to solvent exposure, the solvent can then be introduced to the exposed edge of the contacted components. The solvent will "wick" into the area where the components are in contact while the microstructures remain solvent-free.

As disclosed above, the acetonitrile bonding agent may require thermal activation to create a bond between the polymeric components. The heating can be provided in a number of ways. When the heat is applied to the components by positioning them on a heat source, the heat must be conducted through the components to the bonding interface. This method, while simple, may not be amenable for applications where the substrate is bulky or there are fine structures sensitive to the solvent treatment under thermally activated conditions. Another method that provides the necessary energy at the bonding interface without significantly heating the substrate components is referred to herein as solvent-assisted microwave bonding. In this method the substrate components are prepared for bonding as previously disclosed. However, instead of conventional heating the bulk structure by contacting a high temperature source, the assembled component pair is exposed to microwave energy. The microwaves energy is predominately absorbed by the polar solvent molecules without affecting the bulk plastic component structure, thus heating the bonding interface without bulk heating of the substrates. This method is particularly useful in situations where the heating area needs to be surface restricted. Alternatively, the structure to be bonded or laminated by the weak solvent bonding agent may be cooled prior to weak solvent application. Specifically, acetonitrile solvent lamination and bonding can be used to fabricate diaphragms that can be used as valve and pump structures.

Turning now to FIGS. 1-2, there is an illustration of structures and fabrication methods that may be employed in making microfluidic pumps and valves. FIG. 1A shows a microfluidic structure 10 with a substantially rigid membrane 50 and a rigid substrate 52. The membrane 50 is bonded to the substrate and is in a relaxed state, wherein the membrane 50 lies substantially against the upper surface of the first substrate. In this relaxed state the membrane 50 sits against the upper surface of the substrate 52. In these embodiments, one or both of the substrate 52 and the membrane 50 are made from a plastic material. Examples of suitable materials include linear polymer plastics and thermoplastic materials. Thermoplastic materials include materials that become soft when heated and rigid or substantially rigid when cooled. Typically, one or both of the membrane 50 and the substrate 52 are made from either polymethyl methacrylate, polystyrene, polycarbonate, and acrylic, or some combination. In one particular embodiment, both the membrane 50 and the substrate 52 are made from polystyrene. The appeal of polystyrene arises, at least in part, because polystyrene has known properties, both mechanical properties and properties related to biological interaction.

The membrane 50 may be substantially rigid, in that it is substantially inelastic but may be deformed under appropriate pressure or force. By way of example, the membrane may have a Young's modulus of between about 2 Gpa and about 4 Gpa, although in other applications the Young's modulus may be different. In particular, the material may be selected or fabricated to have a Young's modulus that is suitable for the particular application and/or device being developed. For example, a material may be chosen to have an appropriate Young's modulus, which may depend on the size of microfeatures that exist under the membrane 50 or other device properties. The membrane 50 may have a thickness suitable for allowing deformation upon application of a mechanical force or pressure. The mechanical pressure/force may be applied by physically contacting the membrane 50 and pushing it towards the substrate 52 or pulling it away from the substrate 52. Alternately, the mechanical pressure may be applied by a pneumatic pressure or hydraulic pressure pushing the membrane towards the substrate 52 or pulling it away from the substrate 52. The amount of force or pressure used may depend on the particular application and device being developed. Deformation includes changing the shape of the membrane 50 from a substantially planar configuration to any substantially non-planar configuration. The membrane 50 may have a thickness of between about 10 μm and about 150 μm. In preferred embodiments, the membrane 50 has a thickness of between about 15 μm and about 75 μm. The substrate may have a thickness greater than the thickness of the membrane. Alternately, the substrate may have a thickness substantially similar to the thickness of the membrane. The membrane 50 may be sized such that it can be deformed upon application of a pressure between −14 and 50 psi, a negative pressure of between about −3 psi and about −14 psi, or a positive pressure of between about 3 psi and about 25 psi. In the depicted embodiment, a negative pressure is applied above the membrane to deform the membrane away from the substrate, but a positive pressure may also be applied above the membrane to deform or push the membrane towards the substrate.

The structure is fabricated by selectively bonding specific areas 20 of an interface between two sheets of material leaving an unbonded region of the membrane, or diaphragm, 15, as shown in FIG. 1B. The unbonded region 15 is shown to be substantially circular, but in alternate embodiments may be elliptical, rectangular, rectangular with rounded corners, or other shapes. The substrate 52 is selectively bonded in the area 20 to the membrane 50. This selective bonding can be accomplished by physically separating the portion of the membrane 50 overlying the unbonded region 15 during lamination, by applying an anti-bonding layer to one or both of the other layers 52 and 50 in the unbonded area 15, or by modifying the surface of the layers 52 and 50 in the unbonded area, 15. FIG. 1C shows an alternate view of the structure 10.

As illustrated in FIG. 2, if the diaphragm/unbonded region 15 of the membrane 50 is pulled normal to the planar substrate 52, it will move away from the substrate, or flex upward, forming a blister 59. If the unbonded region 15 of the membrane 50 is pushed normal to the planar substrate 10, it will make conformal contact in the interfacial area 15 between the top and bottom planar layers 50 and 52. This structure and fabrication method can be utilized in making valve and pump structures. As illustrated in FIG. 2, the membrane 50 is joined with an upper side of the substrate 52 and upon actuation is moved away from the substrate. In other embodiments, the membrane may be joined with an underside of the substrate 52. The substrate 52 may have a first membrane joined with its upper side and a second membrane joined with its underside. Both membranes may be simultaneously actuatable, wherein the membranes are both moved away from the respective side of the substrate with which they are joined.

FIG. 3A shows a two-layer active planar valve structure 61 in a closed/relaxed position, and FIG. 3B shows the valve structure 61 in an open/actuated position, wherein the membrane is moved away from the upper surface of the first substrate. The structure comprises a first substrate 60. Two disconnected microchannels 62 and 64 are formed in the first substrate 60. In preferred embodiments, the microchannels are formed in substrate 60 by embossing, molding, or milling. Alternately, the microchannels can be formed by etching. The microchannels and other microfeatures formed in the substrate 60 are preferably suited for the flow of fluid materials. They may also be suitable for gaseous materials, solid materials substantially dissolved in a fluid material such as solutions, fluid materials with particles suspended therein, slurries, or emulsions. A slurry generally refers to a fluidic mixture of substantially insoluble mater. Substrate 60 may also include other interdisposed microfeatures, or features formed in the substrate suitable for manipulation, storage, and/or transport of fluid material, gaseous materials, liquid material, solid materials substantially dissolved in a fluid material such as a solution, fluid materials with particles suspended therein, slurries, and/or emulsions. The microfeatures may include, but are not limited to, other microchannels, microfluidic reservoirs, microfluidic wells, microfluidic ports, and valve seats.

A membrane 66 is selectively bonded to the substrate 60 in substantially all areas 74 outside the unbonded diaphragm area 68. When pressure or force is applied to the membrane 66 normal to the substrate 60 surface to push the membrane towards the substrate, the membrane 66 makes conformal contact with the valve seat area 72 effectively closing communication between the two microchannels 62 and 64, thereby sealing microchannels 62 and 64. Alternately, the membrane does not need to be pushed to form the seal. Instead, when the membrane is in a relaxed state, its weight and rigidity may be sufficient to form an effective seal between the two microchannels 62 and 64. As shown in FIG. 3A, the unbonded region of the membrane 68 at least partially overlies a first channel 62 and a second channel 64 disjoint from the first channel, both channels being disposed in the first substrate 60, and in the relaxed/closed state forms a seal between the first and second channels.

If the membrane 66 is actuated away from the substrate 60 over the valve seat area 72, the membrane may deform into an actuated state, forming a blister 70 over the unbonded diaphragm area 68 and thus forming an open volume between the two microchannels 62 and 64 and allowing fluid to pass from one to the other. As illustrated in FIG. 3B, the unbonded region of the membrane 68 at least partially overlies a first channel 62 and a second channel 64 disjoint from the first channel, both channels being disposed in the first substrate 60, and in the actuated state separates from the upper surface of the first substrate 60 to provide a cavity within blister 70 suitable for fluid flow between the first channel 62 and the second channel 64.

This valve structure is described as planar because the valve seat area 72 is substantially coplanar with the bonded interface 74 that defines the unbonded diaphragm area 68. This process yields a valve structure that is very simple to produce and integrate into more complex microfluidic systems. However, it is very difficult to produce using other lamination practices. For example, if an adhesive lamination procedure were attempted, there are two difficulties with the structure. The adhesive would have some thickness. If it was interposed between the membrane layer 66 and the substrate 60 it will adhere the membrane 66 to the valve seat 72 resulting in an inoperable valve. If the adhesive is selectively removed from the valve seat area 72, a gap results causing leakage. The only option is to replace the adhesive in the valve seat 72 area with another material matching (or slightly exceeding) the adhesive's thickness. This is an extremely difficult process to complete.

Acetonitrile lamination does not suffer from this limitation. One need only assure that the membrane 66 does not bond to the valve seat 72. With an active valve this can be accomplished by physically separating the membrane out of the bonding plane. Alternatively, the surface of the membrane 66 or the valve seat 72 could be treated to prevent bonding. Pretreatments of this type may prevent the valve structure from sealing closed during lamination.

FIGS. 4A and 4B show different aspects of a through hole active planar valve structure 79. In this case, a first substrate 80 is provided. Disconnected microchannels 82 and 84 are formed in this substrate 80 along with a valve seat 86. A through hole 88 is placed in the center of this valve seat 86. A membrane layer 90 is then selectively bonded to the substrate 80 in area 92, creating a diaphragm structure 94. When the valve is in a closed position, the diaphragm 94 may contact the area 86 (the valve seat), and the area under the diaphragm 94, effectively blocking fluid flow between the microfeatures 82 and 84 as well as the fluid flow through the through hole 88. In other embodiments, microchannel 84 is not formed in the substrate 80. There are a number of important features this structure provides. First, the through hole 88 allows communication to microfeatures that may be provided on a lower side 96 of the substrate 80. Secondly, because the membrane 90 has some structural rigidity, there is a certain mechanical advantage attainable when the closing force is larger than the force of a fluid that may be trying to come up through the through-hole 88 to open the valve. This structure takes advantage of the difference in area between the through hole and the upper side of the diaphragm. Since pressure is directly proportional to force and inversely proportional to area, very large pressures in the through hole can be effectively opposed by moderate pressures above the diaphragm. The rigidity of the diaphragm affects this phenomenon.

FIGS. 5A-B show a three-layer active planar valve structure 99, which may be formed using acetonitrile assisted bonding. The valve structure includes a first substrate 100 with interdisposed microchannels 101 and 103. A membrane layer 104 is selectively bonded to the first substrate 100 in areas 106, thus creating a diaphragm structure 108. A second substrate 102 is bonded to the membrane 104. The second substrate includes a drive chamber 110. This structure is different from those shown previously in that a drive chamber 110 encloses the diaphragm 108. When a positive downward pressure is applied to the diaphragm 108 via the drive chamber 110, the membrane 108 contacts the valve seat 112 between the two microfeatures 103 and 101, effectively preventing any transfer of fluid between them. Alternatively, if a negative upward pressure is applied to the drive chamber, the membrane 108 will be lifted from the valve seat 112 and the fluid will be free to communicate between the microfeatures 101 and 103. Pressure may be applied through the drive chamber 110 pneumatically, or by physically contacting the membrane through the drive chamber and drawing it up or pressing it down.

In the embodiment of FIGS. 5A-B, when the membrane 108 is flexed upward, a volume 114 is created underneath the membrane 108. Not only does this allow fluid communication between microchannels 101 and 103, but it also causes some of the fluid in the microchannels 101 and 103 to move into the volume 114. This transfer of fluid makes it possible to form a pump from multiple valve structures.

Figure 6B:
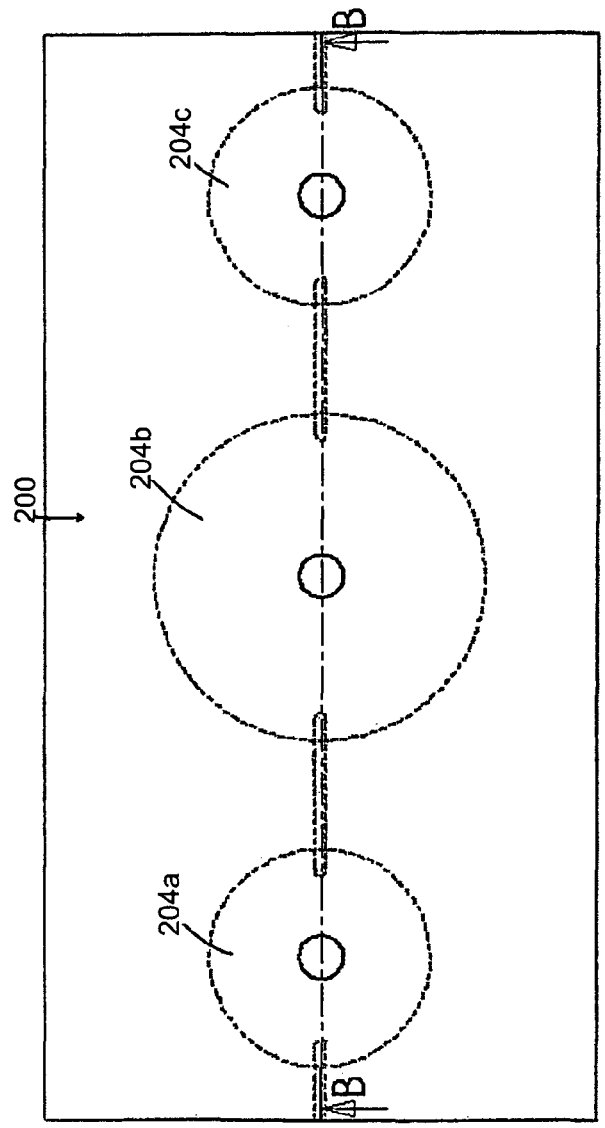

We now discuss microfluidic pump structures consistent with the described system and methods. A microfluidic pump generally refers to any structure or group of structures capable of applying pressure to a fluid, and/or facilitating the flow of fluid in one or more desired directions in a microfluidic device. A number of the valve structures 202 can be placed in series and interconnected by microchannels to form a micro diaphragm pump 200 as shown in FIGS. 6A-B. The pump 200 may be operated in peristaltic-like cycles. When activated in the proper sequence, fluid will be forced through the pump structure. FIG. 6A depicts three valve structures 202a, 202b, and 202c, that make up the pump 200 but other pump embodiments may contain two or more valve structures. In the illustrative embodiment of FIG. 6, the inner valve structure 202b has a larger diaphragm region 204b than the diaphragm regions 204a and 204c of the two outer valve structures. In other embodiments, the pump 200 may comprise valve structures of substantially the same size, or of substantially different sizes.

FIGS. 7A-7F illustrate one method for pumping fluid through the pump structure 300 like the pump structure 200 of FIG. 6. The method comprises cycling the pump structure though six states that are activated sequentially to produce a pumping effect. The pump comprises an inlet valve 302, a drive valve 304, and an outlet valve 306.

In FIG. 7A, the inlet valve 302 is opened and fluid is drawn from inlet microchannel 312 into the volume 302a between the membrane 308 and the first substrate 310. In FIG. 7B, the drive valve 304 is opened, drawing more fluid into the pump system. In FIG. 7C, the inlet valve 302 is closed. In FIG. 7D, the outlet valve 306 is opened. In FIG. 7E, the drive valve 304 is closed, forcing fluid out through the outlet valve 306 into outlet microchannel 318. The outlet valve 306 is then closed. These six states complete one pump cycle, displacing a volume of fluid through the pump. If the cycle is reversed, microchannel 318 serves as an inlet microchannel, microchannel 312 serves as an outlet microchannel, and fluid can be drawn from inlet microchannel 318 to outlet microchannel 312. Thus, the pump is bidirectional. The valve structures 302, 304, and 306 are independently actuatable, in that any one of the valve structures can be actuated with little or substantially no effect on the state of the other valve structures.

Those skilled in the art will recognize that alternate sequences of states may produce a pumping effect. An alternate exemplary pumping sequence, sometimes referred to as a peristaltic sequence, is as follows: Inlet valve 302 is opened, drive valve 304 is opened, outlet valve 306 is opened, inlet valve 302 is closed, drive valve 304 is closed, outlet valve 306 is closed. Drive valve 306 may be opened at substantially the same time as inlet valve 302 is closed.

In the embodiment of FIG. 7, the microchannels 312, 314, 316, and 318 have substantially similar dimensions. In alternate embodiments of pump structures consistent with this invention, the channels may have varying dimensions, including varying lengths, heights, and widths. Channels with varying dimensions may have varying resistances to fluid flow. By way of example, increasing the height and/or width of a microchannel may reduce its resistance to fluid flow. In some embodiments, microchannels with varying resistances to fluid flow may be used to facilitate fluid flow in a desired direction of flow and/or prevent fluid flow in an undesired direction of flow. For example, in the pump cycles described above, there may be a period of time in which inlet valve 302 and drive valve 304 are both in an open state. Fluid may flow through the volume 302a into microchannel 312. In order to reduce the amount of fluid that flows into microchannel 312, microchannel 312 may be formed to have a higher resistance to fluid flow than microchannel 314. As discussed above, alternative pump embodiments may employ two valve structures, instead of the three valve structure pumps depicted in FIGS. 6 and 7. In this embodiment, a two valve bidirectional pump structure may include an inlet/outlet microchannel connected to a first valve structure, an inlet/outlet microchannel connected to a second valve structure, and a microchannel interconnecting the first and second valve structures. The inlet/outlet microchannels may be formed to have a higher resistance to fluid flow than the interconnecting microchannel so that when both valve structures are in an open position, the amount of fluid flowing into the inlet/outlet microchannels may be reduced. The sequence of operation for the two valve pump is similar to the sequence depicted in FIG. 7, particularly the sequence depicted for the valve structures 302 and 304.

Figure 8:
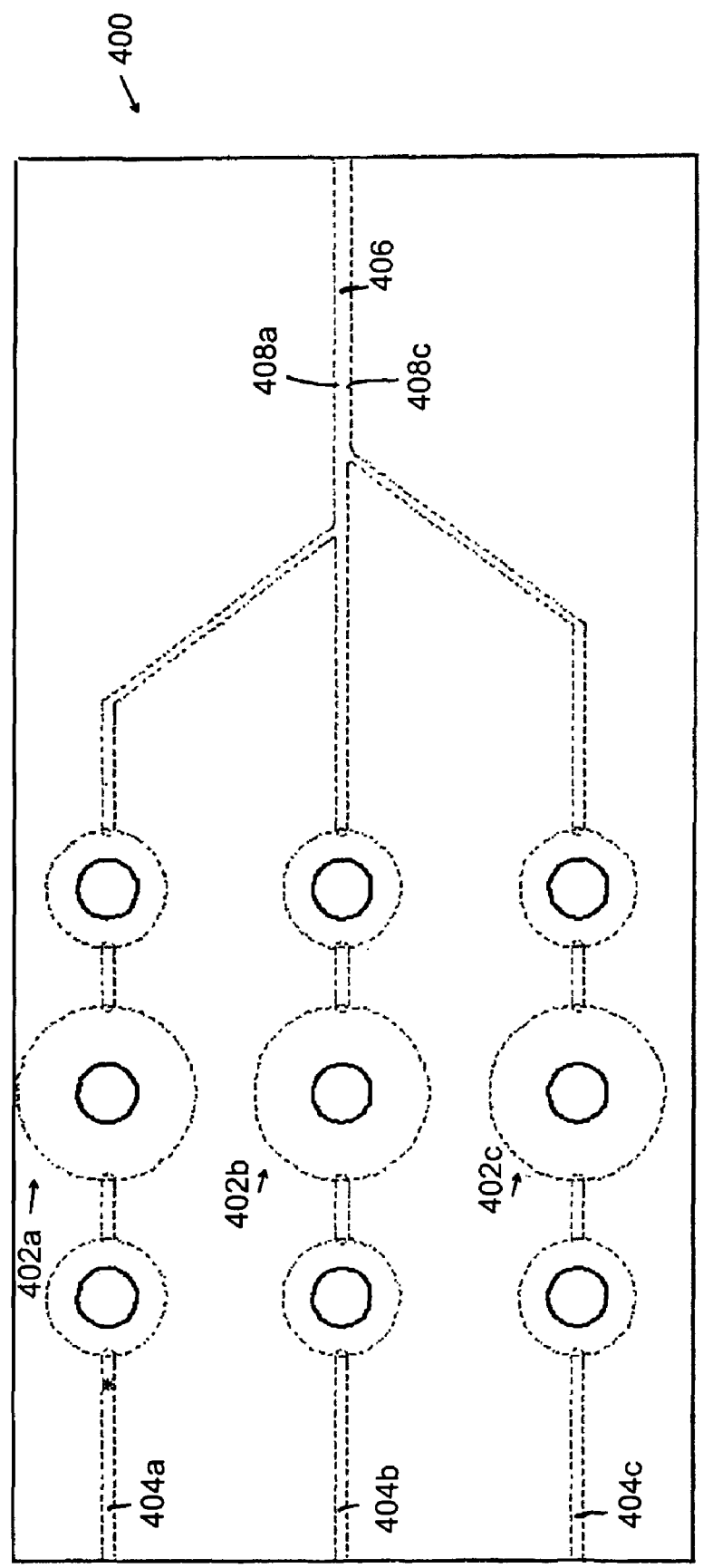
FIG. 8 shows three pumps arranged in a parallel configuration.

FIG. 8 illustrates a microfluidic device 400 with multiple pumps 402a-c arranged in a parallel configuration. This embodiment allows one to draw from multiple inlets 404a-c and displace fluid into one outlet 406. If each of the inlets contains a different fluid, then when the plurality of pumps 402a-c pump fluid into outlet channel 406, the fluid in the outlet channel 406 may contain a gradient distribution of the different fluid types that were stored in inlets 404. For example, an upper portion of the outlet channel 408a may contain a higher concentration of the fluid type flowing from inlet channel 404a, and a lower portion of the outlet channel 408c may contain a higher concentration of the fluid type flowing from inlet channel 404c. Thus, this embodiment may be used to produce chemical gradients in outlet channel 406.

Figure 9:
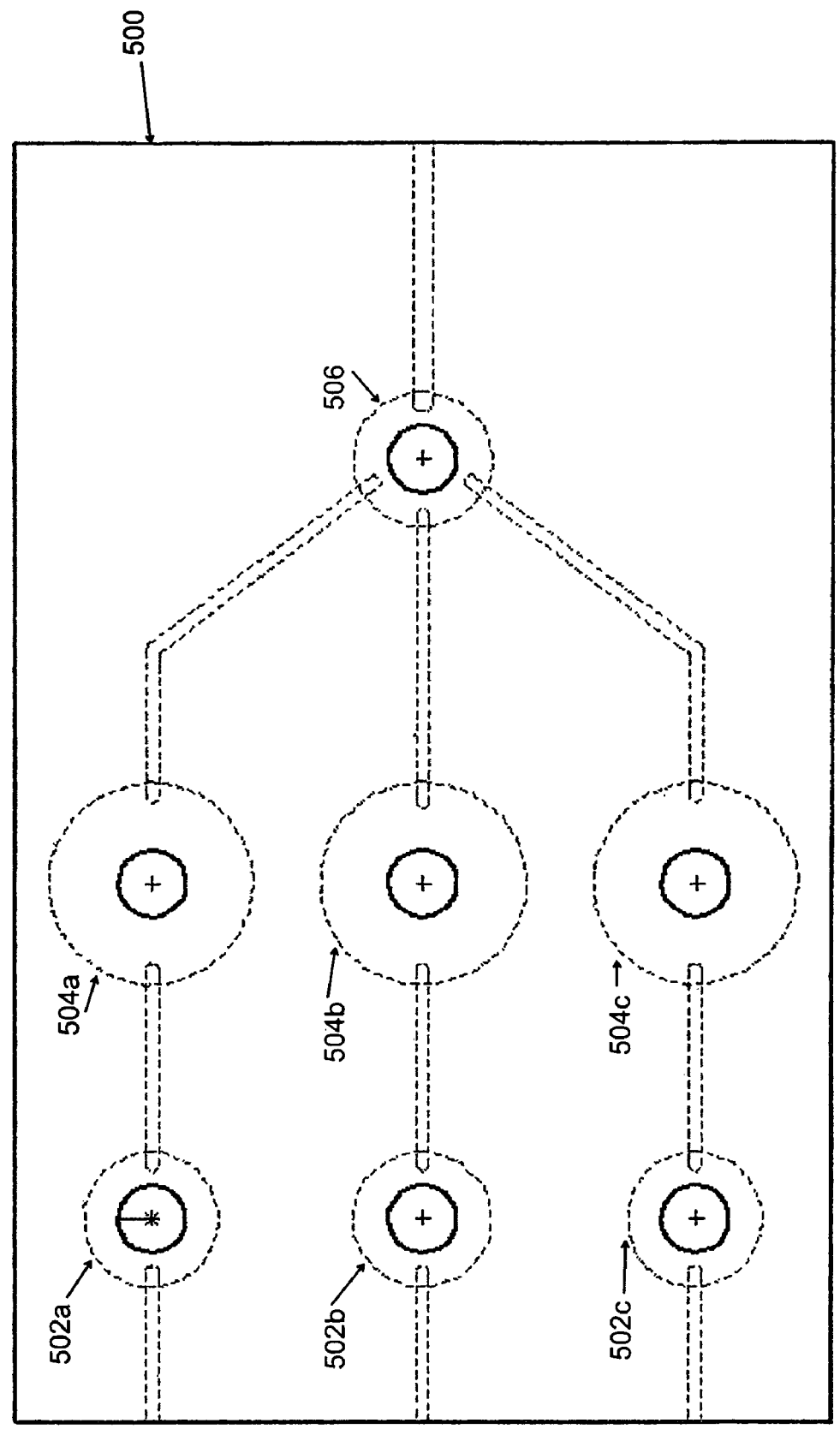
FIG. 9 shows a plurality of pumps that share a valve structure.

Not all of the pump structures need to have independently defined inlet valve, drive valve, and outlet valve structures. A number of pumps can share one or more valves. A shared valve refers to a valve configured such that it may be used in pumping processes by more than one pump structure. FIG. 9 illustrates a microfluidic device 500 comprising 3 pump structures. One pump structure comprises an inlet valve 502a, a drive valve 504a, and an outlet valve 506. A second pump structure comprises an inlet valve 502b, a drive valve 504b, and an outlet valve 506. A third pump comprises an inlet valve 502c, a drive valve 504c, and an outlet valve 506. Thus, the three pumps share outlet valve 506. Alternately, 506 could serve as a shared inlet valve, with 502a-c serving as outlet valves. Such embodiments can be an efficient way to minimize the complexity of the overall system by eliminating redundant structures.

Figure 10:
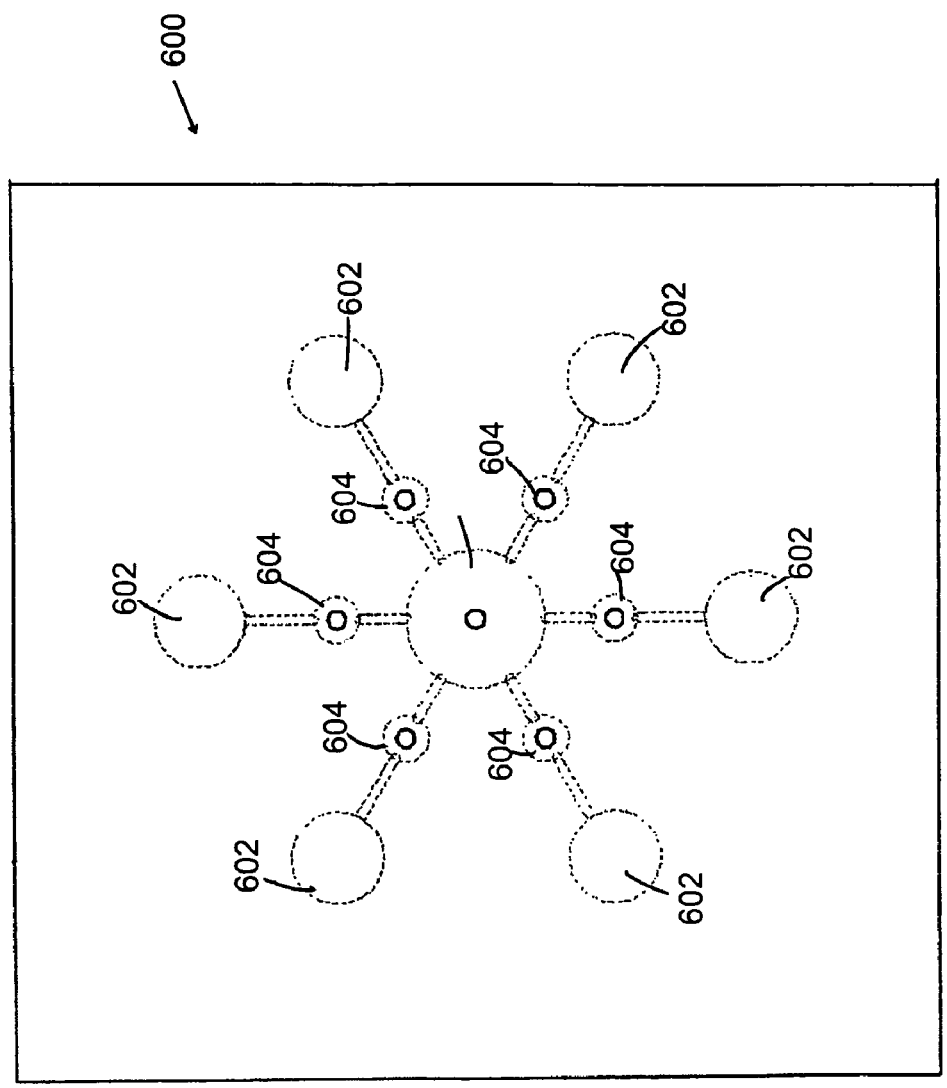
FIG. 10 shows a plurality of pumps that share a drive valve.

FIG. 10 illustrates a pumping structure 600 comprising reservoirs, or fluid ports, 602, inlet/outlet valves 604, and a shared drive valve 606. Fluid ports generally refer to a microfluidic structure, such as a reservoir, that may serve as an inlet or an outlet for fluid that may be pumped by a pump structure, or more generally a reservoir for storing fluid material. In this embodiment, by selectively operating the six inlet/outlet valves 602 in the appropriate sequence with the drive valve 606, fluid can be moved from any of one of the reservoirs 602 to any other one of the reservoirs 602. In this case, there are thirty different flow paths available to the user. Accomplishing this same function using totally independent valve structures would require fifteen different pump systems.

Figure 11:
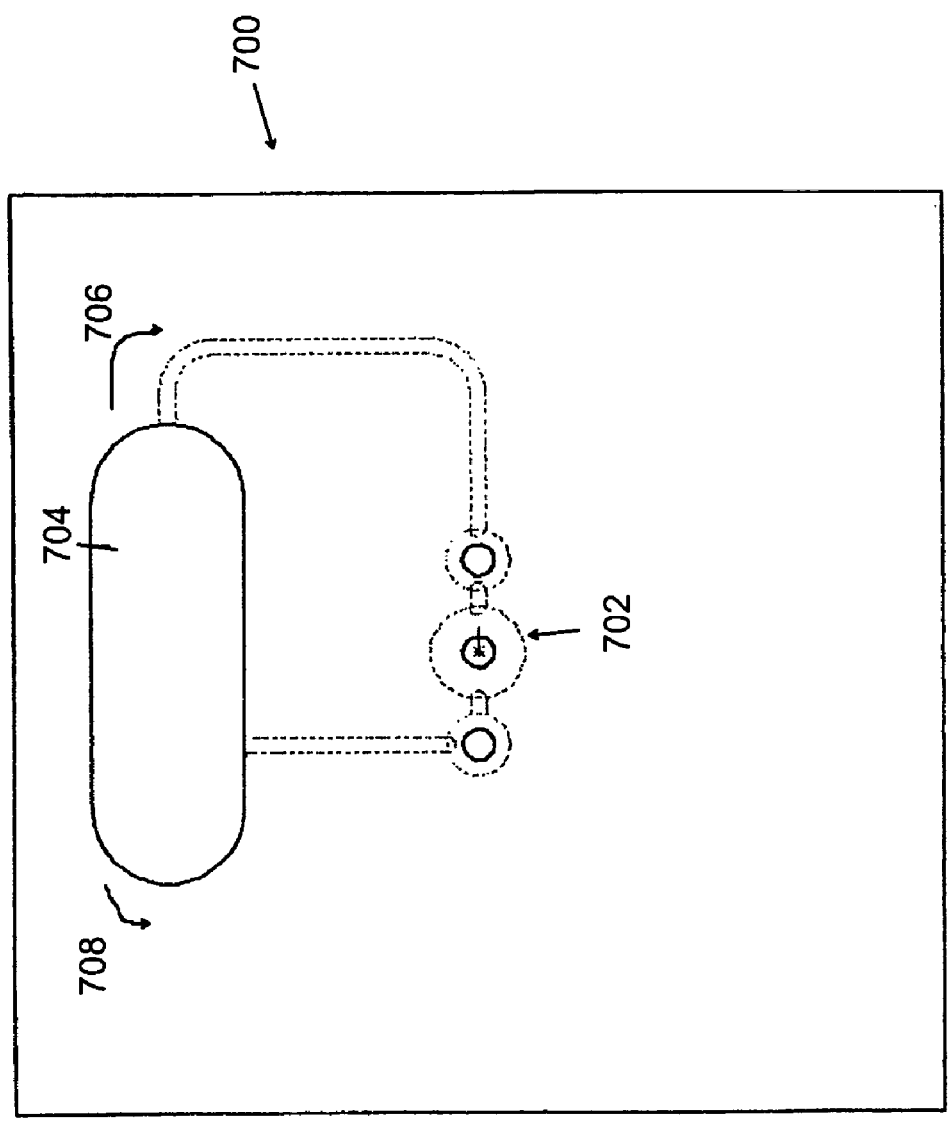
FIG. 11 shows a microfluidic pump interconnected with a microfluidic reservoir.

FIGS. 11-14, depict pump structures that are coupled with reservoirs. FIG. 11 illustrates a microfluidic system 700 comprising a pump 702 integrated as a circulator with a reservoir 704. The pump can remove and replace fluid from the reservoir 704 in either a clockwise 706 or an anticlockwise 708 direction. In embodiments consistent with the invention, the reservoir 704 can be a fluid storage device, a cell culture chamber, or a reaction chamber. The reservoir can be sealed, open, or partially open.

Figure 12:
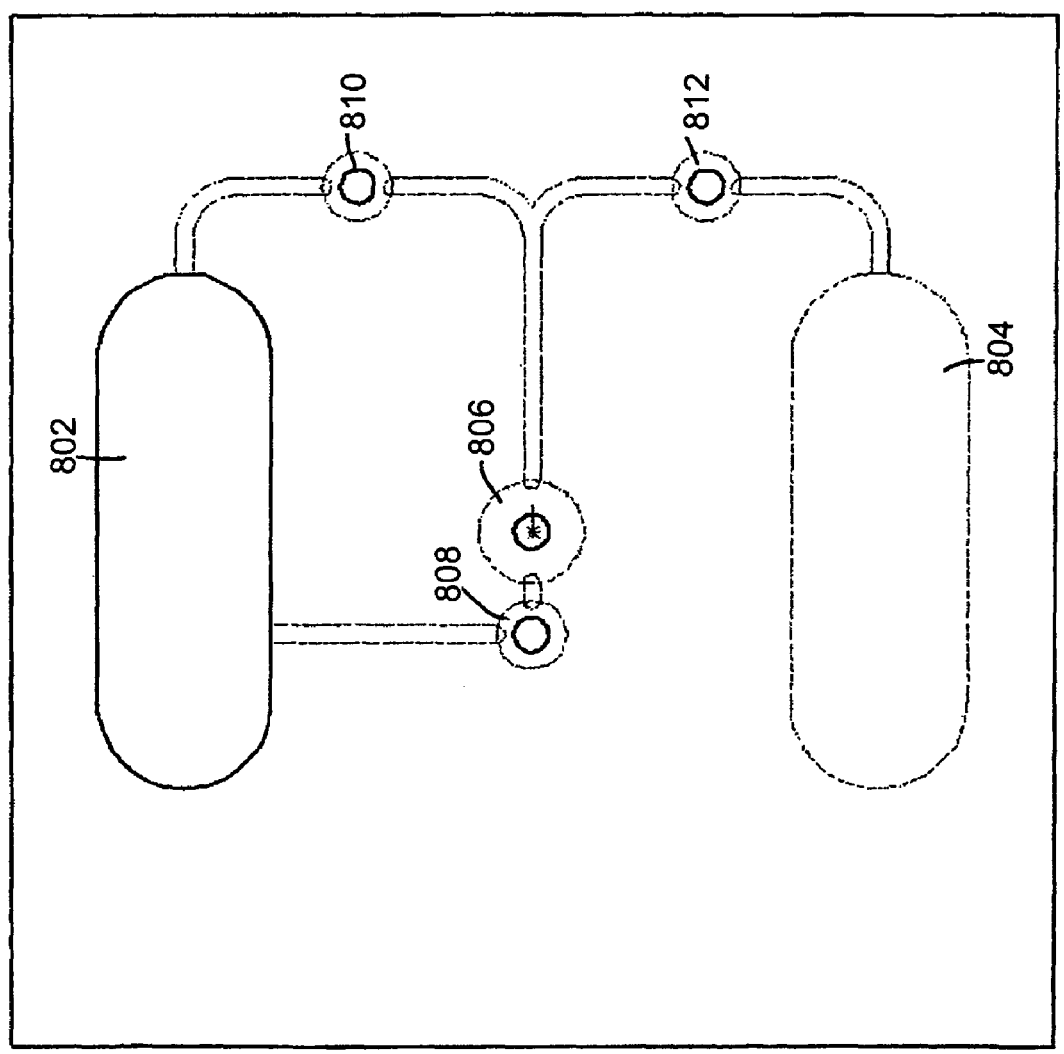
FIG. 12 shows microfluidic pumps interconnected with a plurality of microfluidic reservoirs.

Turning to FIG. 12, multiple reservoirs can be coupled with an integrated pumping system. Microfluidic system 800 includes a top reservoir 802 and a bottom reservoir 804. The pump system, comprising a shared drive valve 806 and inlet/outlet valves 808, 810, and 812, can circulate fluid through the top reservoir 802 while delivering fluid to or removing fluid from the bottom reservoir 804.

Figure 13:
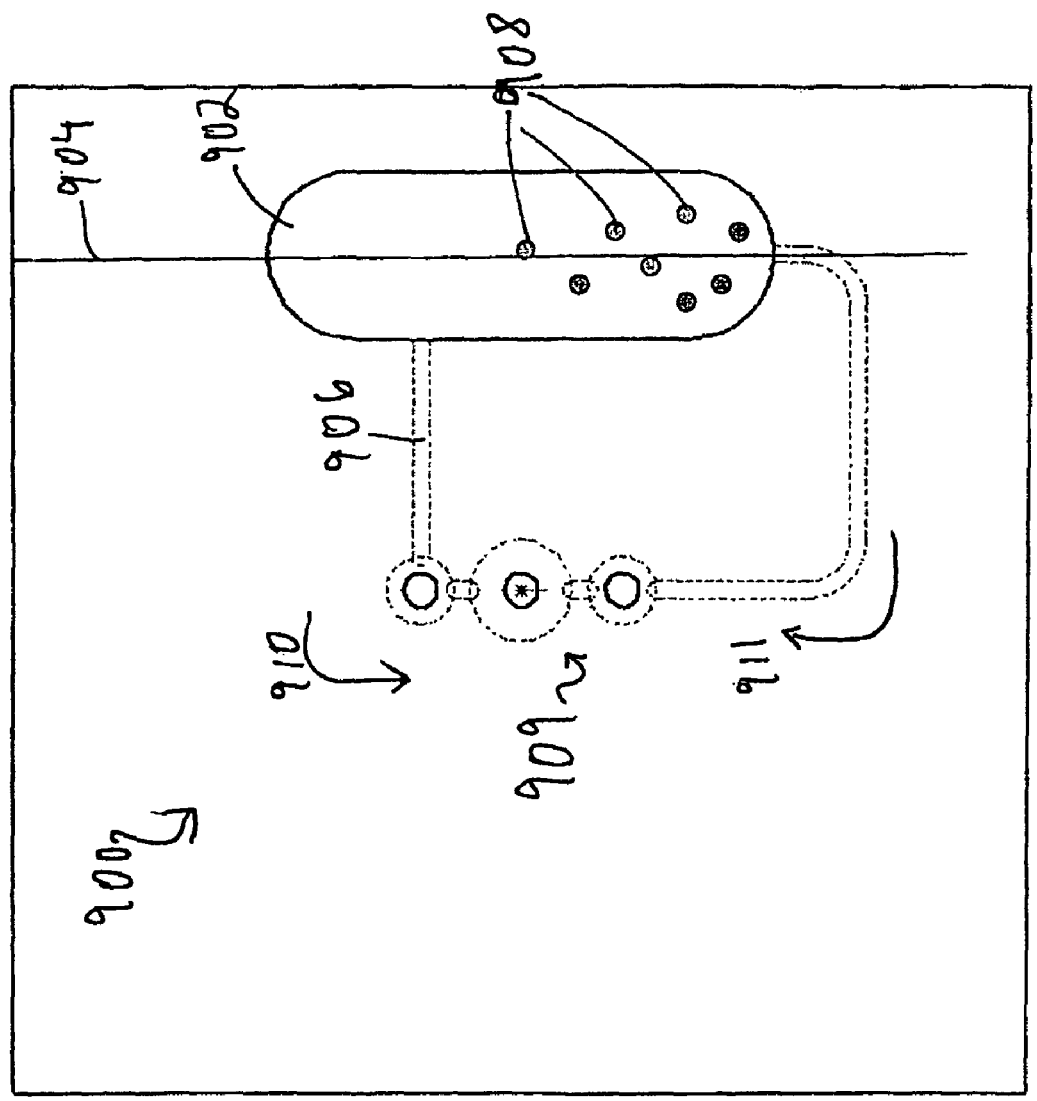
FIG. 13 illustrates the pump and reservoir of FIG. 11, with the reservoir arranged to be vertical and having non-homogenous contents.

If the reservoir features are large enough, for example having a height, length, and width each greater than about 0.5 mm, then the force of gravity may play a substantial role in the fluid mechanics of the system. FIG. 13 illustrates a microfluidic system 900 with a reservoir 902 having a height greater than about 1 mm and arranged with its longitudinal axis 904 substantially vertical. During use of the system, gravity may pull the fluid in the reservoir 902 to the bottom of reservoir 902. Depending on the position of microchannel 906 along the side of the reservoir 902, the fluid can be used to manipulate particles 908 with a density higher than that of the pumped fluid. Each of the particles may be a small or minute quantity of a substantially solid material. For example, if glass beads 908 were present in the reservoir 902, and the microchannel 906 were connected to the reservoir 902 near the top of the reservoir 902, the fluid could be circulated in an anticlockwise 910 direction by pump 909 to elevate the beads from the bottom of the reservoir 902. However, because the beads 908 have a tendency to sink, they would not get near enough to the second microchannel 906 to be removed from the reservoir 902 and circulate through the pump system 900.

Alternately, the particles 908 may be buoyant and have a tendency to rise or float in the reservoir 902. The fluid may be circulated in a clockwise 911 direction by pump 909 to depress the particles 908 from the top of the reservoir 902.

In other embodiments consistent with the invention, the reservoir 902 may be coupled to fluid extraction means for extracting fluid at different vertical locations along the longitudinal axis 904. By way of example, the fluid extraction means may include a plurality of microchannels, each at a different vertical location along the longitudinal axis 904. The microchannels can connect to microfluidic extraction reservoirs or extraction ports from which the fluid may be extracted. Optionally, each of the microchannels may interconnect with a pump structure to facilitate fluid flow from the reservoir 902 to the extraction reservoirs. If a plurality of immiscible fluids are stored in reservoir 902, a gradient may develop within the reservoir with different concentrations of each of the plurality of fluids at different vertical locations along the longitudinal axis 904. A plurality of fluid extraction means at varying vertical locations coupled to the reservoir may provide a means to extract fluid samples of desired concentration levels from within the stratified layers in reservoir 902.

Figure 14:
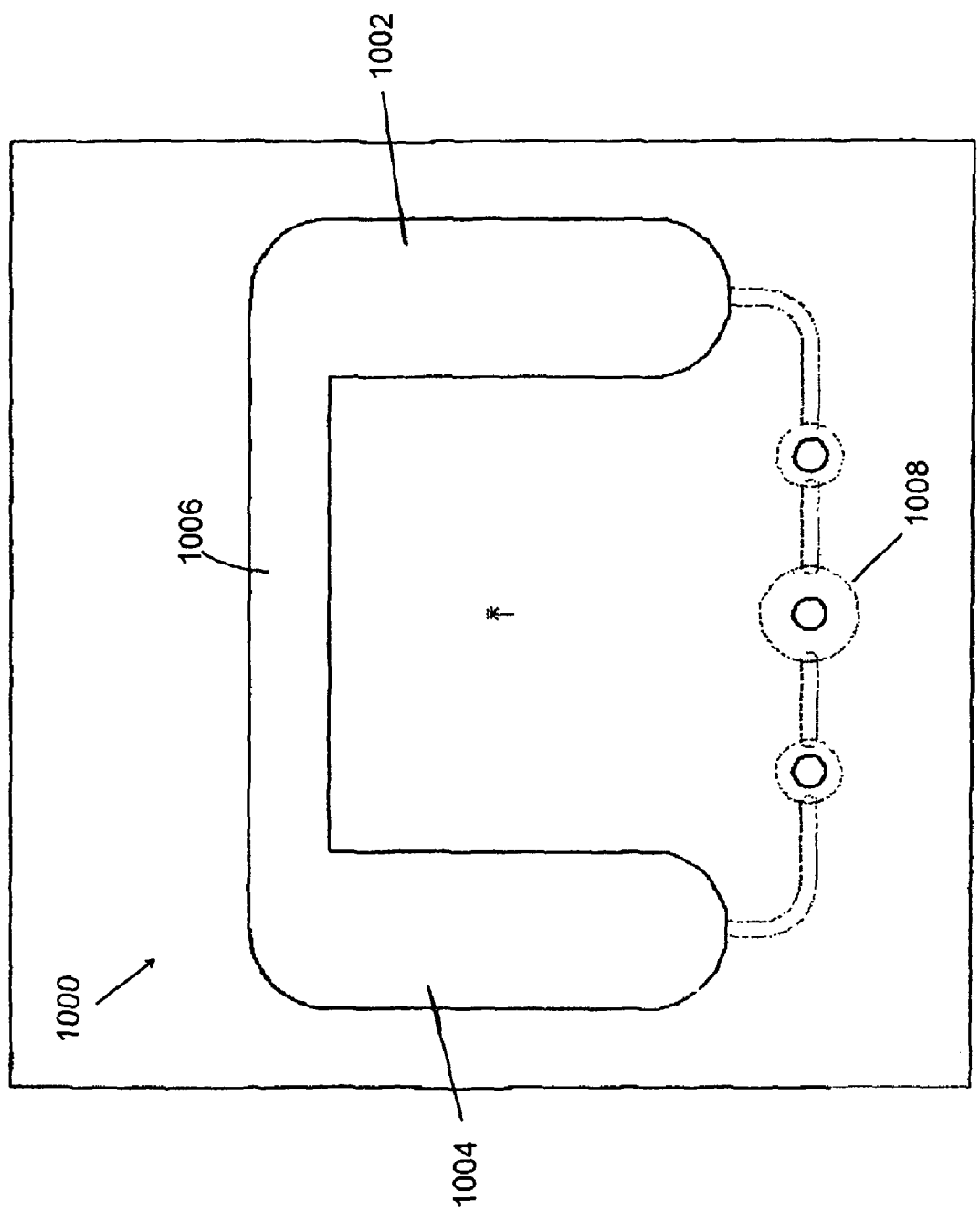
FIG. 14 shows a pump connected with two reservoirs, which are interconnected with each other.

FIG. 14 illustrates a microfluidic system 1000 similar to the embodiment of FIGS. 12-13. However, microfluidic system 1000 includes two reservoirs 1002 and 1004 interconnected by a spillway 1006 which fluid must navigate before reentering the pump 1008 during the circulation process.

Figure 15:
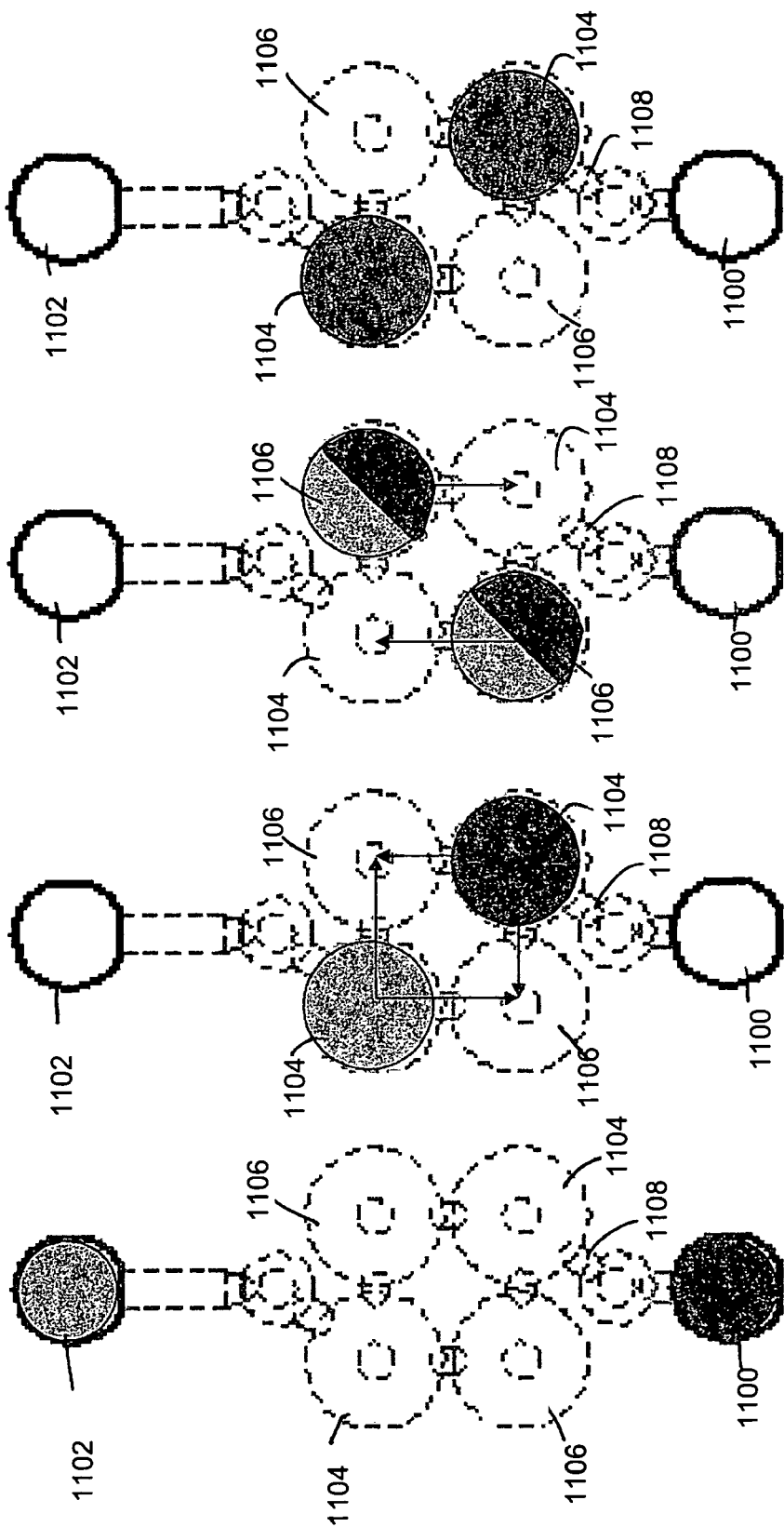
FIGS. 15A-D show a microfluidic mixing device, and illustrates a method of operating the microfluidic mixing device.

FIG. 15 outlines a four-valve structure that can be used as a microfluidic mixer. Reservoirs 1100 and 1102 contain first and second fluid samples respectively. According to a mixing process consistent with this invention, fluid from the reservoirs 1100 and 1102 are moved into a first set of two diagonally opposing valve structures, or reservoir pump chambers, 1104. These pump chambers are closed while simultaneously opening diagonally opposing pump chambers 1106. Part of each of the first fluid sample and the second fluid sample can be transferred into these adjacent chambers 1106 and thereby partially mix. The fluid can then be serially transferred back into the first set of diagonally opposing pump chambers 1104 and the process can be repeated until the two fluid samples are substantially mixed. It should be noted that the connecting channels 1108 have been kept very short to minimize the dead volume of the structure. Since some of the fluid is left in this dead volume, minimization of the dead volume creates a more efficient system overall. Alternately, a microfluidic mixer without connecting channels 1108 may be formed, resulting in a microfluidic mixer with substantially no dead volume, by including overlapping valve structures 1104 and 1106 as illustrated in FIG. 23, to be discussed below.

The mixer may be coupled to a controller capable of sequentially activating the reservoir pump chambers/valve structures 1104 and 1106. The controller may include means to individually or collectively actuate any specified combination of the pump chambers while leaving the other pump chambers in a closed or unactuated position. The controller may physically contact, be positioned above, or be positioned below the mixer device. It may actuate the pump chambers/valve structures by applying mechanical force or pressure by means already discussed herein.

Figure 16:
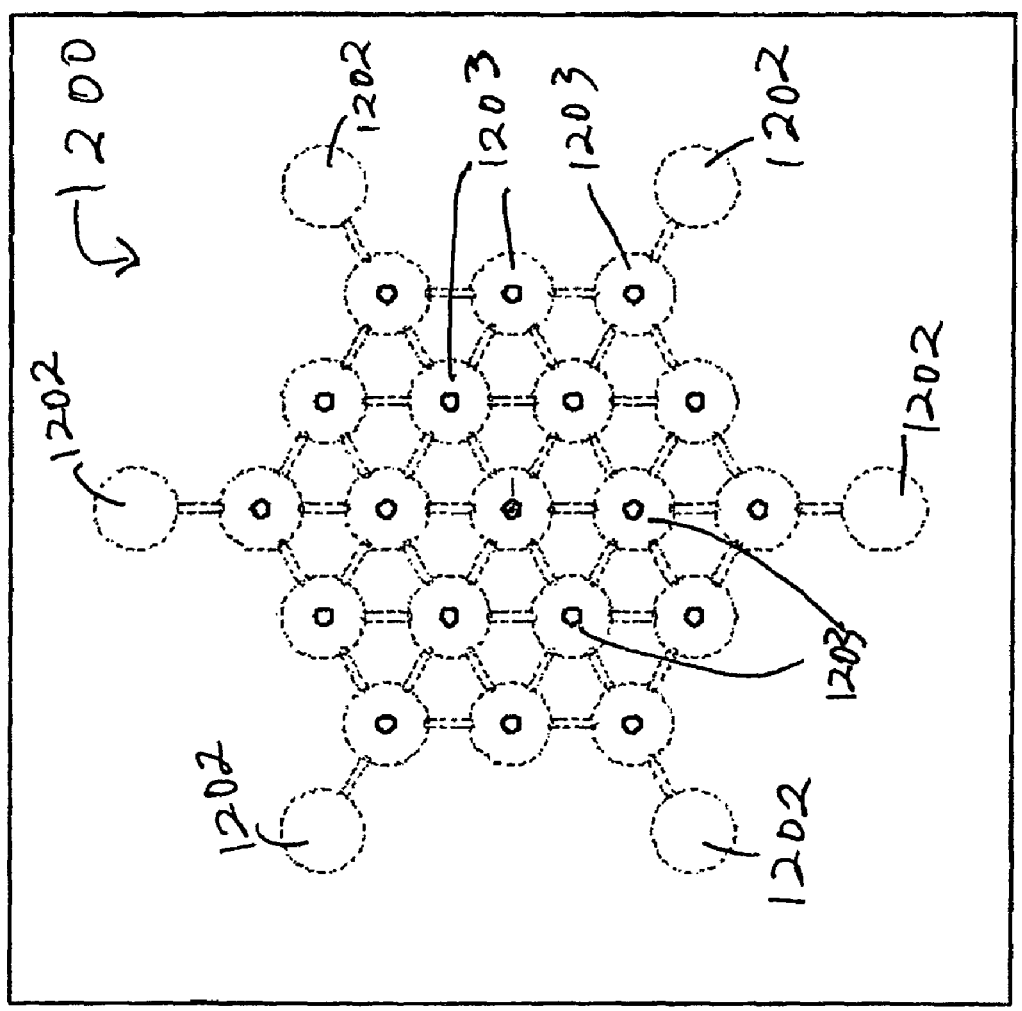
FIG. 16 shows one arrangement of valves and reservoirs interconnected by microchannels.

FIG. 16 shows an example of a generic valve/pump system 1200. Fluids can be moved from any of one the reservoirs 1202 to any other one of the reservoirs 1202 through any sequence of valve structures 1203 by an appropriate sequence of valve 1203 actuations. The fluids can be mixed, incubated, or reacted in other ways defined by a user. Because of its generic nature, this type of arrangement could have uses in the development of specific-use applications.

The active valves described above have many advantages. The user is able to independently control the state of each of the valves in a microfluidic system and thus can easily direct fluids through a network or change the direction of flow in a pump system. Another possibility is the use of passive valves. Passive valves require a force from the fluid for actuation. FIGS. 17A-C illustrates an example of a passive check valve diaphragm pump 1300. The pump 1300 includes two passive check valves 1308 and 1306, and one active valve diaphragm 1304. The passive check valves 1308 and 1306 are actuatable by fluid flowing through the device 1300. The active valve structure 1304 is exogenously actuatable, in that it can be actuated by pressure or force applied by means external to the microfluidic device 1300. Fluid enters from the inlet port 1302 when the diaphragm 1304 is flexed open. This flex causes a negative pressure that is transferred to the inlet 1308 and outlet 1306 valves. A detail of outlet valve 1306 is shown in FIG. 17C. The negative pressure causes the valve diaphragm 1350 to flex up against the valve seat 1352. The orifice 1354 through the diaphragm 1350 is blocked from the fluid channel 1356. Therefore fluid from the exit channel 1358 cannot flow through the orifice 1354 and enter the fluid channel 1356. The inlet valve 1308 acts in exactly the opposite manner. Fluid flows through it and fills a chamber enclosed by the drive diaphragm 1304. When the diaphragm 1304 is actuated back from its flexed position, the fluid that was trapped in the chamber enclosed by the diaphragm 1304 cannot flow back through the inlet valve 1308, so a positive pressure develops in the fluid channel 1356. This pressure actuates the valve membrane 1350 and pushes the membrane 1350 away from the seat 1352 allowing fluid to flow through the orifice 1354 and out to the exit channel 1358. The double check pump described may have very little backflow when operating properly.

Figure 18A:
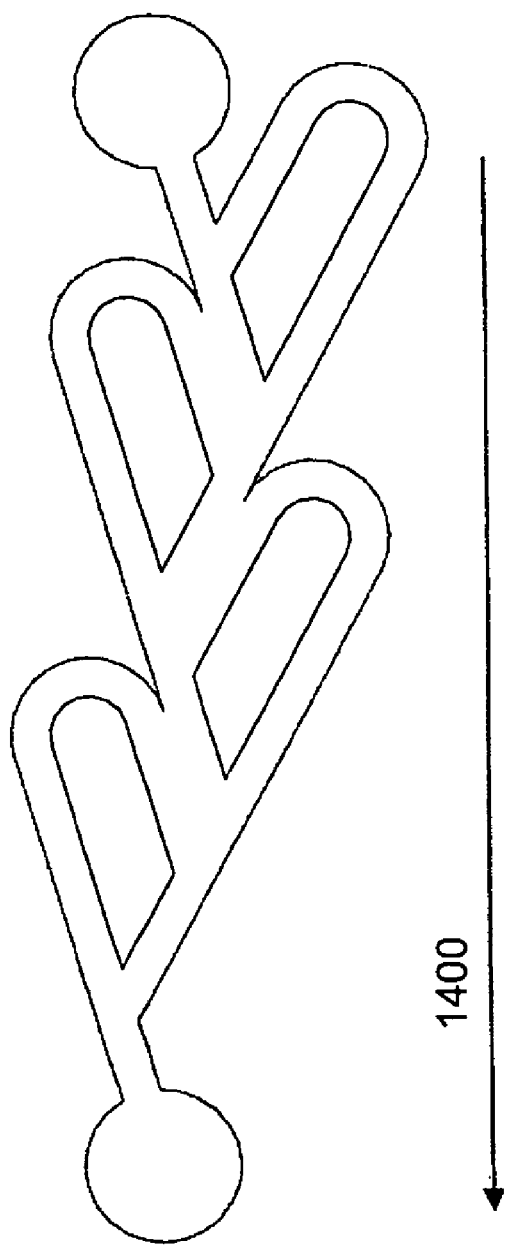
FIGS. 18A and 18A show microchannels that may serve as valves, with low-resistance and high-resistance directions of fluid flow.
Figure 18B:
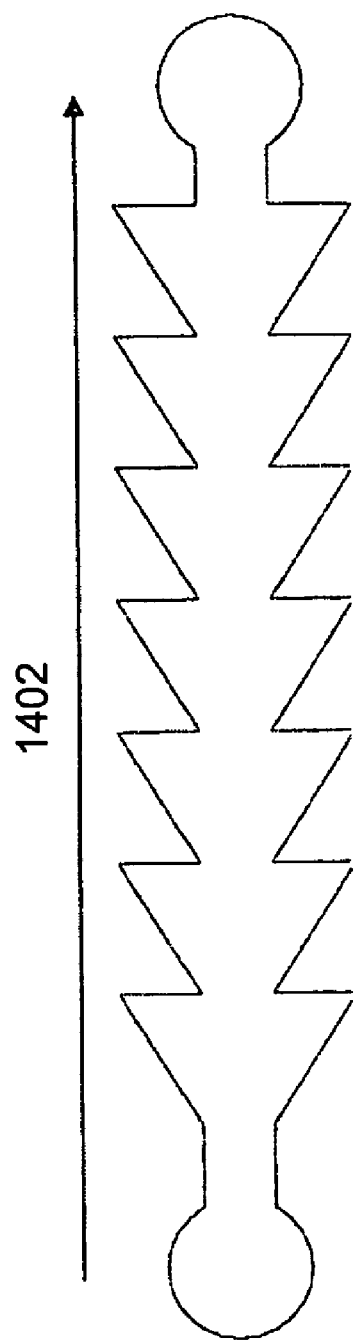

FIGS. 18A-B shows two examples of valves with substantially no moving parts. The structure of FIG. 18A was invented by Nicola Tesla U.S. Pat. No. 1,329,559. The structure of FIG. 18B is a known as a "diffuser" design. In both FIGS. 18A and 18B, the fluid has a higher flow resistance in a first direction 1400 and a lower flow resistance in a second direction 1402. This difference in flow direction can be exploited to produce a net flow. The embodiments of FIGS. 18A-B can be used as microchannels to provide substantially one-way fluid connection between microfluidic features.

Figure 19:
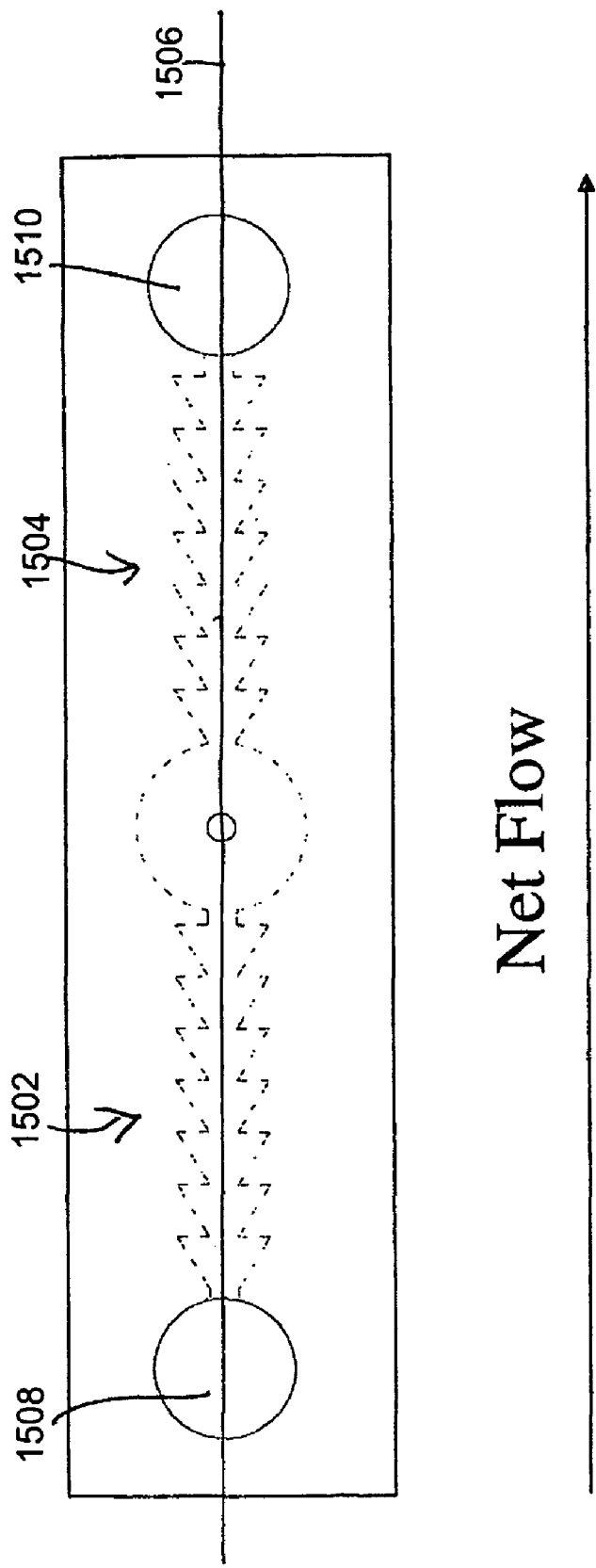
FIG. 19 shows a pump with valves comprising substantially no moving parts.

FIG. 19 shows a pump system 1500 with two diffuser valves 1502 and 1504. There is significant "wash" back and forth through the pump, but a net flow of fluid will move from the inlet 1508 to the outlet 1510 when the fluid is oscillated along a direction substantially along the longitudinal axis 1506 of the system 1500.

Figure 20:
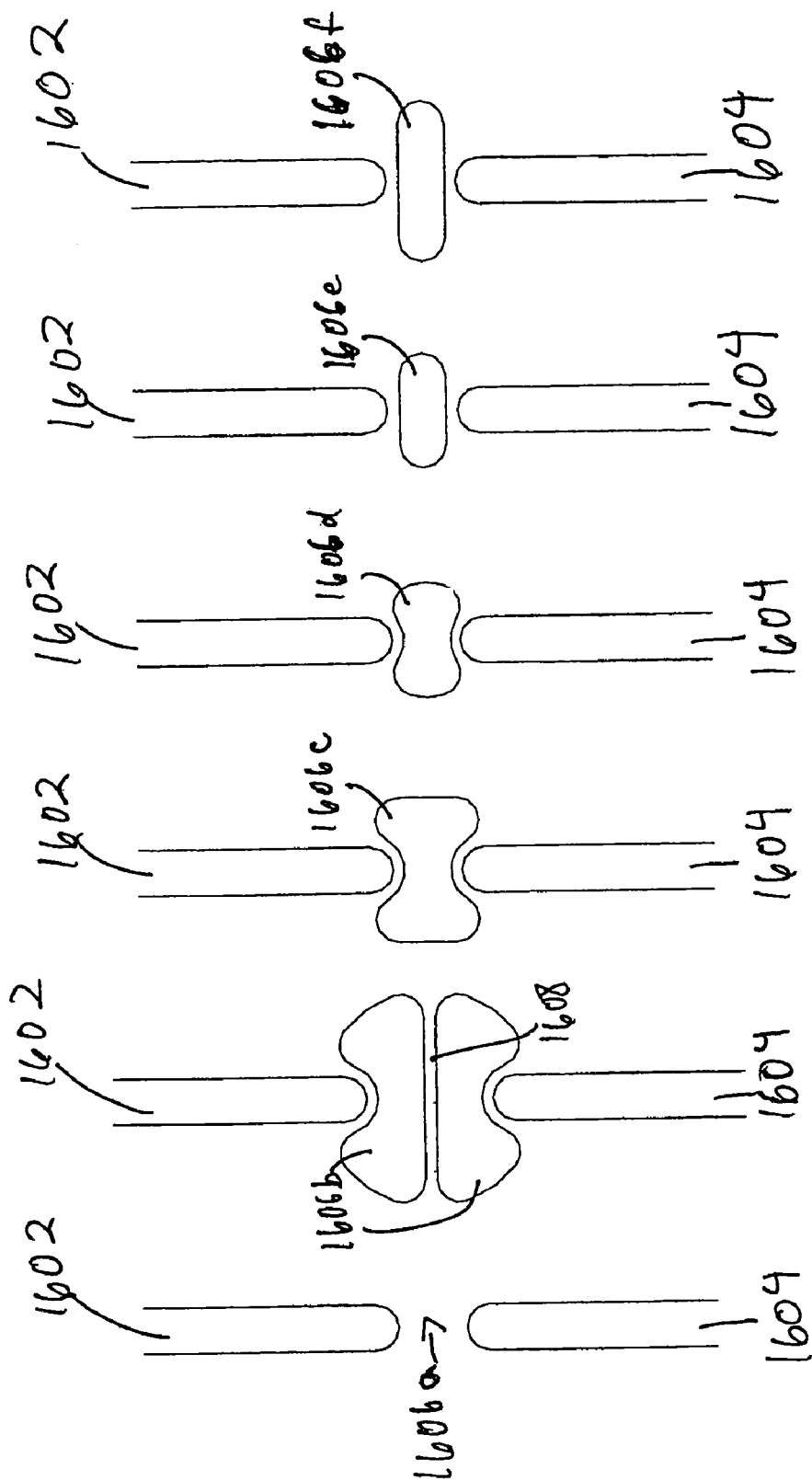
FIGS. 20A-F illustrate various valve and valve seat embodiments consistent with the invention.

The active valves described have been shown as simple round diaphragms with round valve seats. However, the systems and methods described herein are not so limited. FIGS. 20A-F illustrate some other valve embodiments. In these figures, valve seats are disposed between microchannels 1602 and 1604. In general, a valve seat refers to any region on the substrate or any feature formed within the substrate on which an unbonded portion of a membrane may lie on or over. FIG. 20A shows a valve seat 1606a similar to the valve seat of FIG. 3, which is substantially coplanar with the upper surface of the substrate. FIGS. 20B-20F include valve seats 1606b-f that may be depressed structures within the substrate. The valve seats may be formed by embossing, milling, molding or etching. In a preferred embodiment of the invention consistent with FIG. 20B, the valve seat consists of two embossed portions with a ridge 1608 whose upper surface is substantially coplanar with the upper surface of the substrate in which it is formed and disposed substantially perpendicular to a longitudinal axis of the microchannels 1602 and 1604. Ridge 1608 may help to prevent fluid flow between microchannels 1602 and 1604 when the valve is in a closed or relaxed position. These valve seat configurations may serve to provide for a tighter fluid seal between microchannels 1604 and 1602 when the valve is in a relaxed/closed position. Possible valve configurations consistent with this invention may serve to reduce the valve seat area, or to increase the number of discrete valve chambers between an inlet and an outlet of the valve. The valves do not have to be round. In some embodiments, they may be substantially oval, substantially square, substantially rectangular, or any other polygonal shape.

Figure 21:
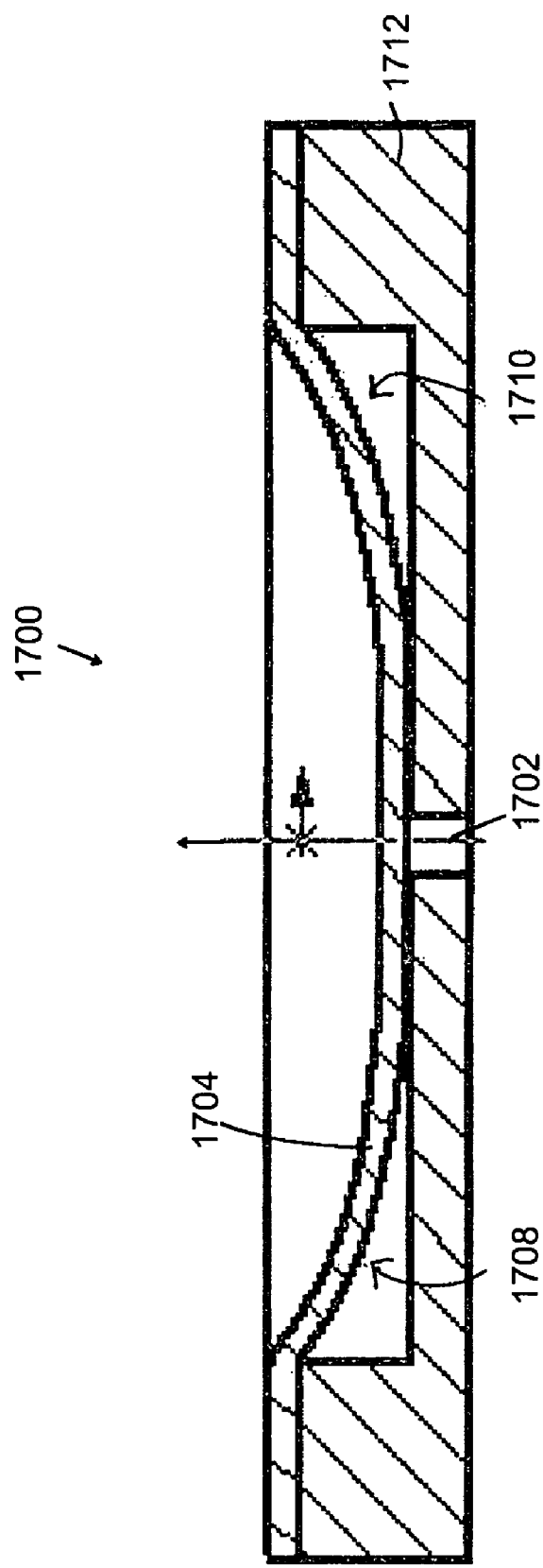
FIG. 21 shows a substantially unsupported actuated membrane deformed within a drive chamber.

FIG. 21 shows a further alternate embodiment of a valve structure. The valve structure 1700 includes a drive chamber 1702 for applying force or pressure to actuate the membrane 1704. FIG. 21 shows the membrane in an actuated state. The membrane is substantially unsupported in the areas 1708 and 1710 where it does not contact the substrate 1712. This may cause stretching and/or deformation resulting from one or more of pressure differences, membrane inconsistencies, and lamination variation.

FIGS. 22A-B illustrates a valve structure 1800 with a chamber 1802 sized and shaped to physically support the membrane 1804 upon actuation. FIG. 22B shows the actuated membrane 1804 substantially flush with the upper surface of the substrate 1806. This may result in consistently repeatable membrane deformation and thus consistently repeatable pump performance. Alternately, the drive chamber may serve as a mechanical stop, in that it may be sized and shaped to limit the deformation of the membrane in its actuated state. This may help to control the volume 1802 of fluid contained in the valve structure 1800 making the performance of the resulting pump more repeatable.

FIG. 23 illustrates a pump structure 1900 for pumping fluid from an inlet 1906 to an outlet 1908. The pump structure includes an upper membrane layer 1911, a lower membrane layer 1910, an upper substrate layer 1914, and a lower substrate layer 1912. The pump structure includes inlet microchannel 1906 and outlet microchannel 1908. In the embodiment of FIG. 23, inlet and outlet microchannels 1906 and 1908 are formed to extend through substantially the entire thickness of the upper membrane layer 1911 and/or a portion of the thickness of upper substrate 1914, as illustrated in the detailed view of FIG. 23D. In one possible method for producing structure 1900 consistent with the invention may include the steps of laminating upper substrate 1914 to upper membrane 1911, and forming microchannels 1906 and 1908 in the resulting laminate. In alternate embodiments, inlet and outlet microchannels 1906 and 1908 need not extend into substrate layer 1914. They may be formed entirely within upper membrane layer 1911, as illustrated in the detailed view of FIG. 23E. An exemplary method for producing such a pump structure may include forming/cutting microchannels in the upper membrane layer 1911, and laminating upper membrane layer 1911 to upper substrate 1914 in a subsequent processing step.

Membrane layer 1910 includes two independent and actuatable diaphragm structures 1916 and 1920. Membrane layer 1911 includes independent and actuatable diaphragm structure 1911. Other embodiments may include two or more actuatable diaphragm structures. Notably, the pump structure need not include microchannels interconnecting the three actuatable diaphragm structures. Each diaphragm 1916b, 1918b, and 1920b can be actuated via a respective drive chamber 1916a, 1918a, and 1920a. In FIGS. 23A-B, each diaphragm structure is shown in an open state. Each diaphragm 1916b, 1918b, or 1920b may also be in closed state, wherein pressure may be applied via the drive chambers 1916a, 1918a, or 1920a respectively to press the diaphragm against the opposing substrate layer 1914 or 1912 as the case may be. An exemplary pumping cycle proceeds as follows: All diaphragms are initially in a closed state. Diaphragm 1916b is opened, and fluid from inlet 1906 flows into the volume 1916c. Diaphragm 1918b is opened, allowing fluid to flow into the volume 1918c. Diaphragm 1916b is closed, and diaphragm 1920b is opened, allowing fluid into volume 1920c. Diaphragm 1918b is closed, resulting in fluid flow into volume 1920c. Diaphragm 1920b is closed, resulting in fluid flow into outlet 1908.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description but rather by the claims appended hereto.

We claim:

1. A method for making an active microfluidic device including at least one planar substrate and a deformable membrane, comprising the steps of:

providing a planar microfluidic substrate having a surface including at least one microfeature;

providing a deformable membrane suitable to cover at least a portion of the surface including the at least one microfeature; and, in the following order:

contacting a non-deformed portion of the membrane with the at least the portion of the surface including the at least one microfeature to cover the at least the portion of the surface including the at least one microfeature;

deforming at least a portion of the membrane covering the at least one microfeature out of the plane of the substrate;

applying a thermally-activatable bonding agent to an interface between the substrate and the non-deformed portion of the membrane; and thermally activating the bonding agent.

2. The method of claim 1, wherein the step of deforming at least a portion of the membrane out of the plane of the substrate comprises physically contacting the at least a portion of the membrane and pulling it away from the substrate.

3. The method of claim 1, further comprising, providing a transverse through-hole in the substrate.

4. The method of claim 1, wherein the step of deforming at least a portion of the membrane out of the plane of the substrate comprises applying at least one of a pneumatic and a hydraulic pressure to the at least a portion of the membrane and pulling it away from the substrate.

5. The method of claim 1, comprising applying a negative pressure in the range between about negative 14 to negative 1 psi.

6. The method of claim 1, further comprising, bonding at least a second substrate to at least a portion of an exposed surface of the non-deformed portion of the membrane.

7. The method of claim 6, further comprising, providing a transverse through-hole in the at least the second substrate.

8. The method of claim 7, further comprising deforming the at least a portion of the membrane out of the plane of the substrate by applying at least one of a pneumatic and a hydraulic pressure to the at least a portion of the membrane via the through-hole.

9. The method of claim 1, wherein the step of contacting the non-deformed portion of the membrane and a bonding surface of the substrate further comprises applying a positive pressure in the range between about 1 to 25 psi.

10. The method of claim 1, wherein the step of deforming at least a portion of the membrane out of the plane of the substrate comprises applying at least one of a pneumatic and a hydraulic pressure to the at least a portion of the membrane, further comprising applying a pressure in the range between about negative 14 to positive 50 pounds per square inch (psi).

* * * * *

UNITED STATES PATENT AND TRADEMARK OFFICE
CERTIFICATE OF CORRECTION

PATENT NO. : 8,293,053 B2
APPLICATION NO. : 12/248521
DATED : October 23, 2012
INVENTOR(S) : Lincoln C. Young and Peng Zhou It is certified that error appears in the above-identified patent and that said Letters Patent is hereby corrected as shown below:

Under the BRIEF DESCRIPTION OF THE DRAWINGS, Column 6, line 19, "FIGS. 18A and 18A show...," the line should be "FIGS. 18A and 18B show...,"

Signed and Sealed this
Ninth Day of April, 2013

Teresa Stanek Rea
*Acting Director of the United States Patent and Trademark Office*